US006340554B1

(12) United States Patent
Kawamura et al.

(10) Patent No.: US 6,340,554 B1
(45) **Date of Patent: *Jan. 22, 2002**

(54) RADIATION-SENSITIVE PLANOGRAPHIC PRINTING PLATE

(75) Inventors: Koichi Kawamura; Kazuo Maemoto; Sumiaki Yamasaki; Tadahiro Sorori; Hiroshi Tashiro; Kiyotaka Fukino, all of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,051

(22) Filed: Jun. 16, 2000

Related U.S. Application Data

(62) Division of application No. 09/152,517, filed on Sep. 14, 1998, now Pat. No. 6,114,083.

(30) Foreign Application Priority Data

| | | |
|---|---|---|
| Sep. 12, 1997 | (JP) | 9-248994 |
| Feb. 3, 1998 | (JP) | 10-22406 |
| Feb. 25, 1998 | (JP) | 10-43921 |
| Mar. 25, 1998 | (JP) | 10-77460 |
| Mar. 31, 1998 | (JP) | 10-87818 |
| Apr. 24, 1998 | (JP) | 10-115354 |

(51) Int. Cl.[7] .......... G03F 7/004
(52) U.S. Cl. .......... 430/270.1
(58) Field of Search .......... 430/270.1, 302, 430/303

(56) References Cited

U.S. PATENT DOCUMENTS

| | | | | |
|---|---|---|---|---|
| 4,308,799 A | | 1/1982 | Kitagawa et al. | 101/457 |
| 4,935,332 A | | 6/1990 | Lauke et al. | 430/272 |
| 5,464,724 A | * | 11/1995 | Akiyama et al. | 430/272 |
| 5,716,756 A | | 2/1998 | Pawlowski et al. | 430/270.1 |
| 5,731,123 A | | 3/1998 | Kawamura et al. | 430/176 |
| 5,945,240 A | * | 8/1999 | Tashiro et al. | 430/49 |

FOREIGN PATENT DOCUMENTS

| | | |
|---|---|---|
| EP | 0652483 A1 | 5/1995 |
| EP | 0855267 A2 | 7/1998 |
| EP | 0932081 A1 | 7/1999 |
| EP | 0938972 A1 | 9/1999 |
| EP | 0941839 A2 | 9/1999 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

An object of the present invention is to provide excellent in terms of durability wherein development with water, or direct production of the plate from digital data through infrared laser recording in particular such that a special process is not necessary, is possible, by forming on a support a photosensitive layer containing a reaction product of a compound having in a molecule thereof a functional group X and a functional group Y and a compound represented by a formula (1) stated below, or alternatively, containing a polymerization product of a compound having the functional group X and a compound represented by the formula (1) stated below. Further by incorporating water-insoluble particles in this photosensitive layer, many voids are formed in the photosensitive layer, further improving sensitivity and discrimination. The functional group X is a group selected from among a sulfonic acid ester group, a disulfone group, a sulfonimide group, and an alkoxyalkyl ester group and the functional group Y is a group selected from among —OH, $—NH_2$, —COOH, $—NH—CO—R_3$, and $—Si(OR_4)_3$ [wherein $R_3$ and $R_4$ each represents an alkyl group or an aryl group].

$$(R_1)_n—X—(OR_2)_{4-n} \qquad (1)$$

(1) is $(R_1)_n—X—(OR_2)_{4-n}$ wherein $R_1$ and $R_2$ each represents an alkyl group or an aryl group; X represents Si, Al, Ti, or Zr; and n represents an integer from 0 to 2.

3 Claims, No Drawings

RADIATION-SENSITIVE PLANOGRAPHIC PRINTING PLATE

This application is a division of Ser. No. 09/152,517 Sep. 14, 1998 U.S. Pat. No. 6,114,083.

FIELD OF THE INVENTION

The present invention relates to radiation-sensitive planographic printing plate which can be used as a positive type planographic original plate. In particular, the present invention relates to radiation-sensitive planographic printing plate which can be directly produced with irradiation by various kinds of lasers based on digital signals, can be developed with water, or is suitable for producing a processing-free printing plate capable of printing by mounting on a printing machine as is without developing.

BACKGROUND OF THE INVENTION

Conventionally, the production of a printing plate from a PS plate (presensitized printing plate) includes a wet developing process for imagewise removing a photosensitive layer formed on the surface of a support after light exposure and a post-treatment process of washing a developed printing plate with washing water and treating the printing plate with a rinse solution containing a surface active agent and with a desensitizing solution containing gum arabic and a starch derivative.

Recently, in the plate-making and printing industries, the rationalization of the plate making work has been promoted, and an original for a printing plate, which can be used for printing as it is after exposure without need of the complicated wet development process as described above and further does not generate alkaline developer waste solution in the developing, has been desired.

An original for a printing plate that does not require a developing process after imagewise exposure, for example, a planographic printing plate formed by laminating on a support a photosensitive hydrophilic layer, the curing and insolubilization of which are accelerated in the light-exposed region together with a photosensitive hydrophobic layer, is disclosed in U.S. Pat. No. 5,258,263. However, because the printing plate has a two-layer structure, adhesion between the upper layer and the lower layer becomes a problem, and a large number of prints cannot be printed.

Also, as a planographic printing original that does not require a wet development process after image forming, a printing material provided with a silicone layer and a laser-thermosensitive layer under the silicone layer is disclosed in U.S. Pat. Nos. 5,353,705 and 5,379,698. Although these printing materials do not require a wet development process, they have the drawback that treatment by rubbing or with a specific roller is required to complete the removal of the silicone layer with laser abrasion, which makes the process complicated.

Also, it is disclosed in Japanese Patent Laid-Open (JP-A) Nos. 5-77574, 4-125189, Japanese Patent Application Publication (JP-B) No. 62-195646, and U.S. Pat. No. 5,187,047 that by using a film obtained by sulfonating a polyolefin and changing the hydrophilic property of the surface thereof by thermal writing, a printing material without need of a development process is formed. In the system, images are formed by desulfonating the sulfone groups on the surface of the printing material and the development process becomes unnecessary, but the system has drawback that a noxious gas is generated during the thermal writing.

Furthermore, U.S. Pat. Nos. 5,102,771 and 5,225,316 disclose a printing material prepared by combining a polymer having an acid-susceptible group in the side chain and a photo acid generating agent, and propose a system which dispenses with a developing process. However, the printing material has the drawback in that because the acid generated by the printing material is a carboxylic acid, the extent of the hydrophilic property is decreased and the printing material is liable to be stained, whereby the printing material is inferior in the durability of the printing material and the sharpness of the printed images.

Also, JP-A No. 4-121748 discloses a printing material prepared by combining a polymer having a sulfonic acid ester group in a side chain, an acid generating agent, and a dye, but in this system, the printing material is developed using an alkaline developing solution and there are no proposals for any system which employs water-processing or dispenses with a developing process.

As radiation-sensitive image-forming material suitable for the production of a printing material for positive type processing-free planographic printing, the image-forming material is known as described in JP-A No. 7-186562 and also is described in JP-A Nos. 9-26878 and 9-26877 by the present inventors. In the patent publication and patent specifications are described compounds each composed of a specific carboxylic acid ester or a sulfonic acid ester structure and having a functional group capable of changing from a hydrophobic property to a hydrophilic property by heating or by the action of an acid and a functional group capable of reacting with a hydrolytic polymerizable compound having a trimethoxysilyl group. By using these compounds, printing materials which can perform printing without performing a development process after exposure, and satisfactory prints can be obtained, but further improvement in printing durability is still desired.

SUMMARY OF THE INVENTION

Accordingly, an object of the present invention is to provide a radiation-sensitive planographic printing plate which can be developed with water or does not require a specific treatment such as wet development processing, rubbing, and the like, after image writing. More particularly, the object of the present invention is to provide a radiation-sensitive planographic printing plate capable of making a printing plate directly from digital data by recording using a solid laser or a semiconductor laser or the like, which radiate an infrared ray.

Another object of the present invention is to provide a positive type radiation-sensitive planographic printing plate having excellent printing durability.

Still another object of the present invention is to provide a positive type radiation-sensitive planographic printing plate causing less background staining and having excellent sensitivity.

It has now been discovered that the above-described objects can be attained by the present invention described below.

Namely, a first aspect of the present invention is radiation-sensitive planographic printing plate comprising a support having formed thereon a photosensitive layer containing a reaction product of a compound having at least one functional group selected from a sulfonic acid ester group, a disulfone group, a sulfonimide group, and an alkoxyalkyl ester group and at least one functional group selected from —OH, $—NH_2$, —COOH, $—NH—CO—R_3$, and $—Si(OR_4)_3$, wherein $R_3$ and $R_4$ each represents an alkyl group or an aryl group and when both of $R_3$ and $R_4$ exist in a compound having these functional groups, they may be the same or different, and a hydrolytic polymerizable compound represented by the following formula (1) in the same molecule;

$$(R_1)_n\text{—}X\text{—}(OR_2)_{4-n} \qquad (1)$$

wherein $R_1$ and $R_2$, which may be the same or different, each represents an alkyl group or an aryl group; X represents Si, Al, Ti, or Zr; and n represents an integer of from 0 to 2.

According to the radiation-sensitive planographic printing plate of the first aspect of the present invention, the hydrolytic polymerizable compound represented by the above-described formula (1) causes a hydrolytic polymerization to form a matrix of an inorganic oxide in the photosensitive layer-coated film and also forms an organic-inorganic composite (reaction product) by reacting with a functional group (functional group (a-2)) of a compound having in the same molecule at least one functional group (sometimes referred to below as functional group (a-1)) selected from a sulfonic acid ester group, a disulfone group, a sulfonimide group, and an alkoxyalkyl ester group and at least one functional group (sometimes referred to below as functional group (a-2)) selected from —OH, —$NH_2$, —COOH, —NH—CO—$R_3$, and —$Si(OR_4)_3$, wherein $R_3$ and $R_4$ each represents an alkyl group or an aryl group and when both of $R_3$ and $R_4$ exist in a compound having these functional groups, they may be the same or different (hereinafter, the compound is sometimes referred to as "compound A"), and there are multiple functional groups reacting with each other to increase the density of the cross-linked structure in the molecule, whereby the film strength is improved as a whole and a photosensitive layer having excellent printing durability is obtained.

In the radiation-sensitive planographic printing plate of the first aspect of the present invention, after irradiating imagewise compound A with radiation such as heat or light and the like, the compound A becomes hydrophilic imagewise due to heat from a predetermined heating means or due to a predetermined acid-generating means relating to irradiation with a predetermined light. As a result, after image formation, the printing plate can perform printing without a development process being performed and satisfactory prints as well as the above-described excellent printing durability can be obtained.

Also, a second aspect of the present invention is radiation-sensitive planographic printing plate comprising a support having formed thereon a photosensitive layer containing a compound having at least one functional group (functional group (a-1)) selected from a sulfonic acid ester group, a disulfone group, a sulfonimide group and an alkoxyalkyl ester group and the hydrolytic polymerization product of a hydrolytic polymerizable compound represented by the following formula (1)

$$(R_1)_n\text{—}X\text{—}(OR_2)_{4-n} \qquad (1)$$

wherein $R_1$ and $R_2$, which may be the same or different, each represents an alkyl group or an aryl group; X represents Si, Al, Ti, or Zr; and n represents an integer of from 0 to 2.

According to the radiation-sensitive planographic printing plate of the second aspect of the present invention, the hydrolytic polymerizable compound represented by the above-described formula (1) causes hydrolytic polymerization to form a matrix (a hydrolytic polymerization product) of an inorganic oxide in the coated film, and the compound having at least one functional group selected from a sulfonic acid ester group, a disulfone group, a sulfonimide group, and an alkoxyalkyl ester group (hereinafter, sometimes referred to as "compound B") is included in the above-described matrix and enters a state of being diffused, whereby film strength is improved as a whole.

In the radiation-sensitive planographic printing plate of the second aspect of the present invention, the compound B becomes hydrophilic imagewise, due to an acid from a predetermined acid-generating means or due to heat from a predetermined heating means. As a result, after image formation, the printing can be performed without a development process, and satisfactory prints as well as excellent printing durability can be obtained.

The radiation-sensitive planographic printing plate of the present invention can perform thermosensitive recording without the need for any further processing and can also be used as an infrared laser-sensitive thermosensitive positive type planographic original plate by combining with a light-heat conversion material (infrared absorbent). Also, by combining with an acid generating agent sensitive to light between the ultraviolet region and the visible light region, it can be used as an ultraviolet-visible light-sensitive thermosensitive positive type planographic original plate.

Furthermore, a third aspect of the radiation-sensitive planographic printing plate of the present invention is also characterized in that the photosensitive layer, containing one of the above-described compound A and compound B and also containing the hydrolytic polymerization product, is combined with a plurality of water-insoluble particles. By using the plurality of water-insoluble particles in the photosensitive layer, the above-described compound coats the water-insoluble particles and acts as a binder, whereby the water-insoluble particles are partially bonded to each other via the compound to form a photosensitive layer having multiple voids inside thereof.

Thereby, the function described before as being the effect of the present invention is improved. Namely, when a layer, in which the water-insoluble particles are dispersed so densely that the water-insoluble solid particles come into contact with each other and which has an uneven surface, is formed on a support, if the surfaces of the particles are hydrophilic, water is retained in the void portions between the particles to form a hydrophilic surface, while when the surfaces of the particles are hydrophobic, water does not soak into some void portions between the particles and the particle surfaces form water-repellent, that is, oleophilic surfaces. When the layer of the water-insoluble solid fine particles has a function of changing imagewise from a hydrophobic layer to a hydrophilic layer, by making the layer a printing surface, a printing plate can be made. Accordingly, because the water-insoluble particles form a structure wherein they are partially bounded to each other, the surface area of the above-described compound is greatly increased and the discriminating faculty between the imaged portion and the non-imaged portion is increased.

To realize this technical conception, the following are necessary: (i) a particle dispersion technique having a high level dispersion ability such that the particles are brought into close contact with each other at a high density such that water-holding property and water-repelling property are realized and such that layer formation is possible when the particles have surface unevenness and (ii) a technique capable of concretely imparting a function of changing this dispersed substance from that of a hydrophobic property to that of a hydrophilic property, responding to imaging signals.

In the present invention, by holding the compounds having the function of realizing (i) and (ii), respectively at the surfaces of the water-insoluble solid particles, the realization of the technical conception is attempted. Practically, by holding the compound having the functional group (a-1) capable of cross-linking by reacting with the functional groups of the surface of the adjacent particle for (i) and the compound having the functional group (a-2) becoming hydrophilic by the action of an acid, radiation, or heat for (ii) to the surfaces of the water-insoluble solid particles and by forming the layer of the structural material formed by the solid particle dispersed product, the acid-, radiation-, or heat-sensitive planographic original plate is realized, which is the object of the present invention.

In particular, the present inventors have found that the compound having the functional group (a-2) capable of cross-linking by reacting with a functional group of the surface of the adjacent particle described above may be different from the compound having the functional group (a-1) becoming hydrophilic by the action of an acid, radiation, or heat (that is, an example of one containing the above-described compound B) but the compound having both the functional groups (a-1) and (a-2) is useful as described above (that is, an example of one containing the above-described compound A).

In addition, the term "radiation" used in the specification of the present invention is the same as "radiation" used as a JIS standard term or as a technical term and includes electromagnetic waves such as ultraviolet rays, visible light, infrared rays, X rays, γ rays, and the like., and particle rays. However, in certain cases, "light" may be used to represent "radiation". Also, in a broad sense, "radiation sensitivity" includes light-mode heat-sensitive recording, that is, sensitivity to "heat" from the radiation-heat energy conversion.

Accordingly, "a photosensitive layer" in the present invention means "radiation-sensitive recording layer" which can carry out recording in response to the radiation necessary for recording of the present invention.

DETAILED DESCRIPTION OF THE INVENTION

The present invention is described in detail below.

Compound A

The compound A used in the first aspect of the present invention is explained hereinafter.

The compound A is a compound having at least one functional group selected from a sulfonic acid ester group, a disulfone group, a sulfonimide group, and an alkoxyalkyl ester group and at least one functional group selected from —OH, $—NH_2$, —COOH, $—NH—CO—R_3$, and $—Si(OR_4)_3$, wherein $R_3$ and $R_4$ each represents an alkyl group or an aryl group and when both of $R_3$ and $R_4$ exist in the compound having these functional groups, they may be the same or different.

Firstly, practical examples of at least one functional group selected from a sulfonic acid ester group, a disulfone group, a sulfonimide group, and an alkoxyalkyl ester group (sometimes referred to below as "functional group X") will be described in detail.

The sulfonic acid ester group can be shown by the following formula (2), the disulfone group by the following formula (3), and the sulfonimide group by the following formula (4), respectively.

$$—L—SO_2—O—R^1 \quad (2)$$

$$—L—SO_2—SO_2—R^2 \quad (3)$$

$$—L—SO_2—N(R^4)—SO_2—R^3 \quad (4)$$

wherein L represents an organic group made up of a polyvalent non-metallic atoms necessary for bonding the functional group shown by formula (2), (3), or (4) to a polymer skeleton; $R^1$ represents a substituted or unsubstituted aryl group, a substituted or unsubstituted alkyl group, or a cyclic imide group; $R^2$ and $R^3$ each represents a substituted or unsubstituted aryl group or a substituted or unsubstituted alkyl group; $R^4$ represents a substituted or unsubstituted aryl group, a substituted or unsubstituted alkyl group, or $—SO_2—R_5$ (wherein $R^5$ represents a substituted or unsubstituted aryl group or a substituted or unsubstituted alkyl group.).

When $R^1$ to $R^5$ each represents an aryl group or a substituted aryl group, the aryl group includes a carbocyclic aryl group and a heterocyclic aryl group. As the carbocyclic aryl group, an aryl group having from 6 to 19 carbon atoms, such as phenyl, naphthyl, anthracenyl, pyrenyl, and the like, is used. Also, as the heterocyclic aryl group, an aryl group having from 3 to 20 carbon atoms and from 1 to 5 hetero atoms, such as pyridyl, furyl, quinolyl condensed with a benzene ring, benzofuryl, thioxanthone, carbazole, and the like, is used. When $R^1$ to $R^5$ each represents an alkyl group or a substituted alkyl group, as the alkyl group, a straight chain, branched or cyclic alkyl group having from 1 to 25 carbon atoms, such as methyl, ethyl, isopropyl, t-butyl, cyclohexyl, and the like, is used.

When $R^1$ to $R^5$ each represents a substituted aryl group, a substituted heteroaryl group, or a substituted alkyl group, the substituent includes an alkoxy group having from 1 to 10 carbon atoms, such as methoxy, ethoxy, and the like; a halogen atom such as fluorine, chlorine, bromine, and the like; a halogen-substituted alkyl group such as trifluoromethyl, trichloromethyl, and the like; an alkoxycarbonyl group or aryloxycarbonyl group each having from 2 to 15 carbon atoms, such as methoxycarbonyl, ethoxycarbonyl, t-butyloxycarbonyl, p-chlorophenyloxycarbonyl, and the like; a hydroxy group; an acyloxy group such as acetyloxy, benzoyloxy, p-diphenylaminobenzoyloxy, and the like; a carbonate group such as t-butyloxycarbonyloxy, and the like; an ether group such as t-butyloxycarbonylmethyloxy, 2-pyranyloxy, and the like; a substituted or unsubstituted amino group such as amino, dimethylamino, diphenylamino, morpholino, acetylamino, and the like, a thioether group such as methylthio, phenylthio, and the like; an alkenyl group such as vinyl, styryl, and the like; a nitro group; a cyano group; an acyl group such as formyl, acetyl, benzoyl, and the like; an aryl group such as phenyl, naphthyl, and the like; and a heteroaryl group such as pyridyl, and the like. Also, when $R^1$ to $R^5$ each represents a substituted aryl group or a substituted heteroaryl group, as the substituent, an alkyl group such as methyl, ethyl, and the like, can be used in addition to the above-described ones.

When $R^1$ represents a cyclic imide group, as the cyclic imide, a cyclic imide having from 4 to 20 carbon atoms, such as succinic acid imide, phthalic acid imide, cyclohexanedicarboxylic acid imide, norbornenedicarboxylic acid imide, and the like, can be used.

Particularly preferable groups from the above-described groups as $R^1$ are an aryl group substituted by an electron attracting group such as halogen, cyano, nitro, and the like; an alkyl group substituted by an electron attracting group such as halogen, cyano, nitro, and the like, a secondary or tertiary branched alkyl group, a cyclic alkyl group, and a cyclic imide.

Particularly preferable groups as $R^2$ to $R^5$ from the above-described groups are an aryl group substituted by an electron attracting group such as halogen, cyano, nitro, and the like; an alkyl group substituted by an electron attracting group such as halogen, cyano, nitro, and the like; and a secondary or tertiary branched alkyl group.

The polyvalent linkage group made up of non-metallic atoms represented by L is a linkage group made up of from 1 to 60 carbon atoms, from 0 to 10 nitrogen atoms, from 0 to 50 oxygen atoms, from 1 to 100 hydrogen atoms, and from 0 to 20 sulfur atoms. As the more practical linkage group, there are the linkage groups constituted by the combination of the following structural units.

P11-(2)

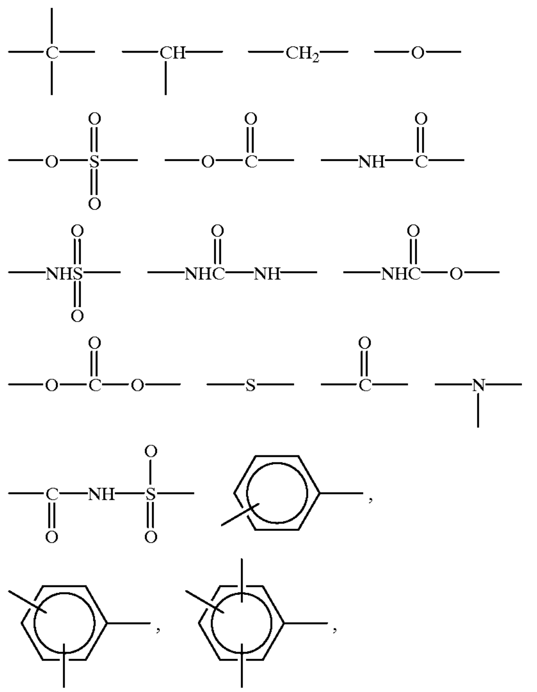

polyvalent naphthalene polyvalent anthracene

When the polyvalent linkage group has a substituent, as the substituent, an alkyl group having from 1 to 20 carbon atoms, such as methyl, ethyl, and the like; an aryl group having from 6 to 16 carbon atoms, such as phenyl, naphthyl, and the like; a hydroxy group; an acyloxy group having from 1 to 6 carbon atoms, such as carboxy, sulfonamide, N-sulfonylamide, acetoxy, and the like; an alkoxy group having from 1 to 6 carbon atoms, such as methoxy, ethoxy, and the like; a halogen atom such as chlorine, bromine, and the like; an alkoxycarbonyl group having from 2 to 7 carbon atoms, such as methoxycarbonyl, ethoxycarbonyl, cyclohexyloxycarbonyl, and the like; a cyano group; and a carbonic acid ester group such as t-butyl carbonate, and the like, can be used.

The alkoxyalkyl ester group can be shown by following formula (5);

(5)

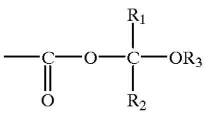

wherein $R_1$ represents a hydrogen atom; $R_2$ represents a hydrogen atom or an alkyl group having from 1 to 18 carbon atoms; and $R_3$ represents an alkyl group having from 1 to 18 carbon atoms. Also, two groups from $R_1$, $R_2$, and $R_3$ may combine to form a ring. In particular, it is preferred that $R_2$ and $R_3$ combine to form a 5-membered or 6-membered ring.

In the first aspect of the present invention, groups shown by the above formulate (2) to (5) may be used as a functional group, however, a particularly preferable group is the sulfonic acid ester group represented by the formula (2).

Specific examples of a monomer having functional group (s) represented by any of the formulae (2) to (5), which is suitably used for the synthesis of the compound A in the first aspect of the present invention, are shown below.

(1)

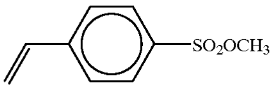

(2)

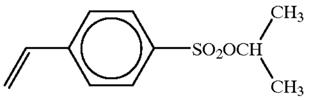

(3)

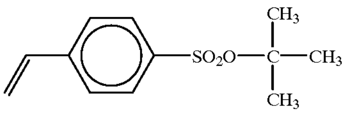

(4)

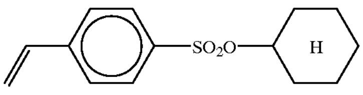

(5)

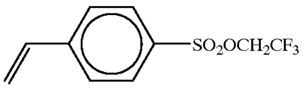

(6)

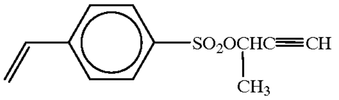

(7)

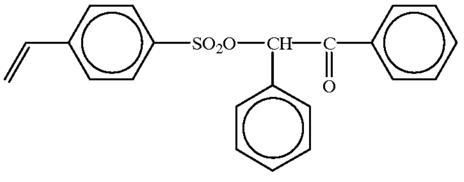

(8)

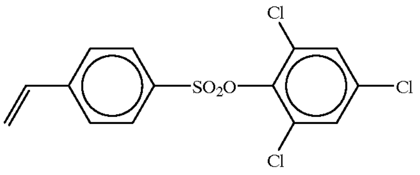

(9)

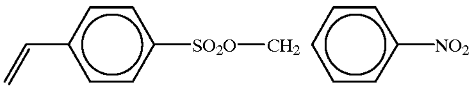

(10)

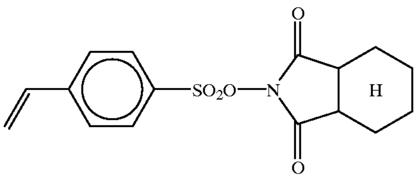

-continued
(11)
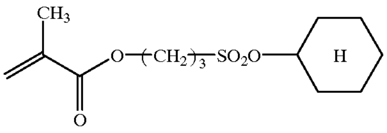
(12)
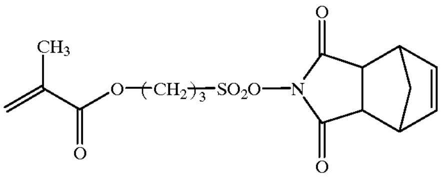
(13)
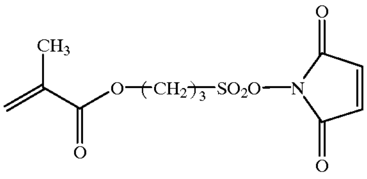
(14)
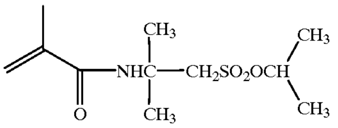
(15)
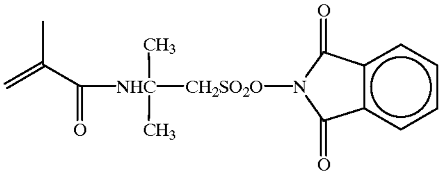
(16)
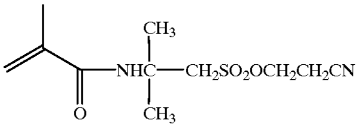
(17)
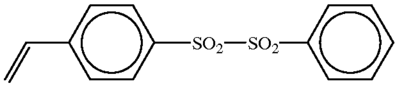
(18)
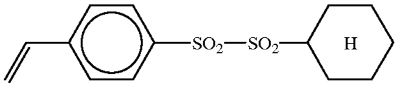
(19)
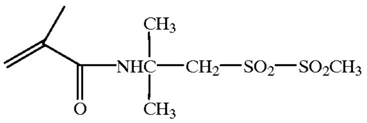
(20)
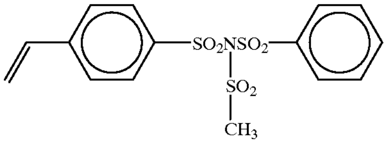
-continued
(21)
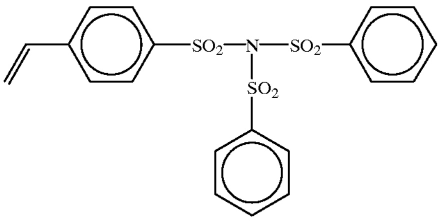
(22)
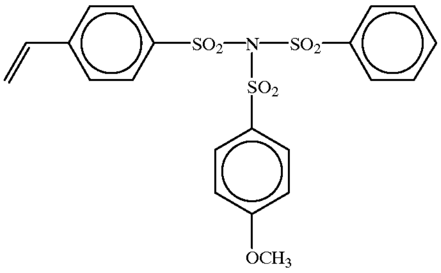
(23)
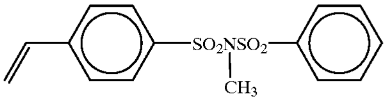
(24)
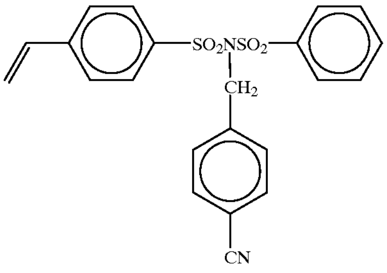
(25)
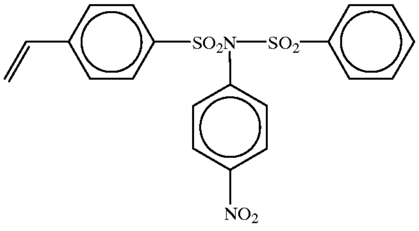
(26)
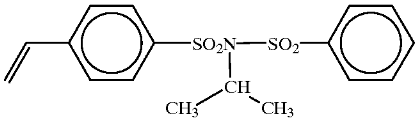
(27)
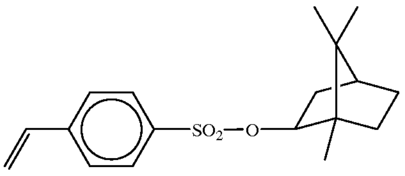

-continued (28)

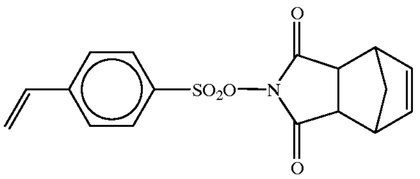

(29)

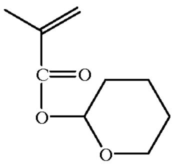

The functional group X has a function of changing the compound A from a hydrophobic property to a hydrophilic property by the action of heat or an acid. In particular, it is preferred that the functional group X is a group lowering the water droplet contact angle in air of the compound A by 15° or more. That is, it is preferable that the compound A is a compound whose contact angle of a water droplet in air is lowered by the action of heat or an acid by 15° or more and the initial hydrophobic property of the compound becomes a hydrophilic property. Furthermore, it is preferred that the compound A is a compound of lowering the water droplet contact angle thereof in air by 40° or more. Also, practically, the compound A is preferably a compound whose the initial waterdrop contact angle in air of 60° or higher is lowered by the action of heat or an acid to 20° or lower.

Next, specific examples of at least one functional group (hereinafter, is sometimes referred to as "functional group Y") selected from —OH, —$NH_2$, —COOH, —NH—CO—$R_3$, and —$Si(OR_4)_3$ [wherein $R_3$ and $R_4$ each represents an alkyl group or an aryl group and when both of $R_3$ and $R_4$ exist in the compound having these functional groups, they may be the same or different] will be explained in detail.

When the functional group Y is —NH—CO—$R_3$, and/or —$Si(OR_4)_3$, $R_3$ and $R_4$ each is preferably an alkyl group having from 1 to 10 carbon atoms or an aryl group having from 6 to 20 carbon atoms, and they may be substituted by a halogen atom such as chlorine, and the like.; an alkoxy group such as methoxy, and the like.; or an alkoxycarbonyl group such as methoxycarbonyl, and the like.

Specific examples of —NH—CO—$R_3$ includes —NH—CO—$CH_3$, —NH—CO—$C_2H_5$, and the like. Also, specific examples of —$Si(OR_4)_3$ include —$Si(OCH_3)_3$, —$Si(OC_2H_5)_3$, and the like.

As the compound A used in the first aspect of the present invention, a high-molecular weight compound obtained by the radical polymerization of at least one monomer having the functional group(s) represented by any of the formulae (2) to (5) and a monomer having the above-described functional group Y is preferably used. As such a compound A, a copolymer using only one kind of the monomers having the functional group(s) represented by any of the formulae (2) to (5) and only one kind of the monomers having the above-described functional group B may be used but a copolymer using 2 or more kinds of the monomers as one or both of the monomers described above, or a copolymer of one or more these monomers and one or more of other monomers may also be used.

As the above other monomers, a monomer having a cross-linking reactivity, such as glycidyl methacrylate, N-methylolmethacrylamide, 2-isocyanate ethyl acrylate, and the is preferred.

Also, the above other monomers used for the copolymer may include known monomers such as acrylic acid esters, methacrylic acid esters, acrylamides, methacrylamides, vinyl esters, styrenes, acrylic acid, methacrylic acid, acrylonitrile, maleic anhydride, maleic acid imide, and the like.

Specific examples of the acrylic acid esters include methyl acrylate, ethyl acrylate, (n- or i-)propyl acrylate, (n-, i-, sec-, or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, 2-(hydroxyphenylcarbonyloxy)ethyl acrylate, and the like.

Specific examples of the methacrylic acid esters include methyl methacrylate, ethyl methacrylate, (n- or i-)propyl methacrylate, (n-, i-, sec-, or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, 2-(hydroxyphenylcarbonyloxy)ethyl methacrylate, and the like.

Specific examples of the acrylamides include acrylamide, N-methylacrylamide, N-ethylacrylamide, N-propylacrylamide, N-butylacrylamide, N-benzylacrylamide, N-hydroxyethyl-acrylamide, N-phenylacrylamide, N-tolylacrylamide, N-(hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide, N-hydroxyethyl-N-methylacrylamide, and the like.

Specific examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, N-hydroxyethyl-N-methylmethacrylamide, and the like.

Specific examples of the vinyl esters include vinyl acetate, vinyl butyrate, vinyl benzoate, and the like.

Specific examples of the styrenes include styrene, methylstyrene, dimethylstyrene, trimethylstyrene, ethylstyrene, propylstyrene, cyclchexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene, and the like.

In these other monomers described above, acrylic acid esters having not more than 20 carbon atoms, methacrylic acid esters, acrylamides, methacrylamides, vinyl esters, styrenes, acrylic acid, methacrylic acid, and acrylonitrile are particularly preferably used.

The mixing ratio of the monomer(s) having the functional group(s) represented by any of the formulae (2) to (5) to the monomer(s) having the functional group Y used for synthesis of the copolymer is preferably from 10/90 to 99/1, and more preferably from 30/70 to 97/3 by weight ratio.

Also, in the case of the copolymer of the monomer(s) described above and other monomer(s), the ratio which is used for the synthesis of the copolymer of other monomer(s) to the sum total of the monomer(s) having a functional group representedby any of the formulae (2) to (5) and the monomer(s) having the functional group Y, is preferably from 5 to 99% by weight, and more preferably from 10 to 95% by weight.

Specific examples of the compound A used in the first aspect of the present invention are shown below. In addition, in each chemical formula, the numerical value at the right lower side of the parenthesis is the copolymerization ratio.

(I-3)

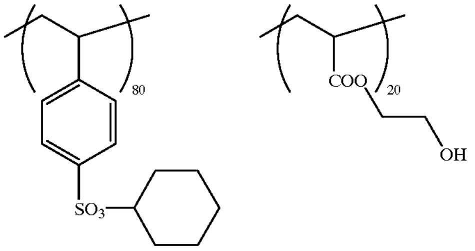

(I-4)

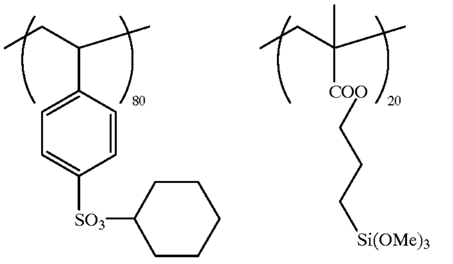

(I-5)

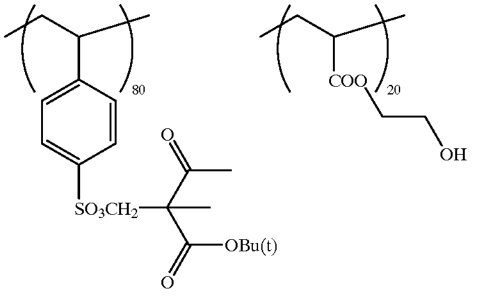

-continued (I-6)

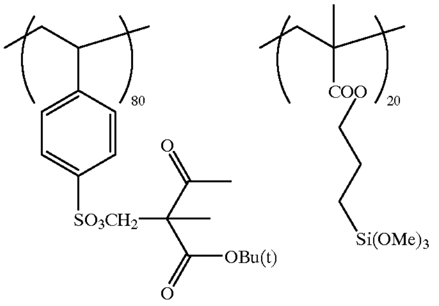

(I-7)

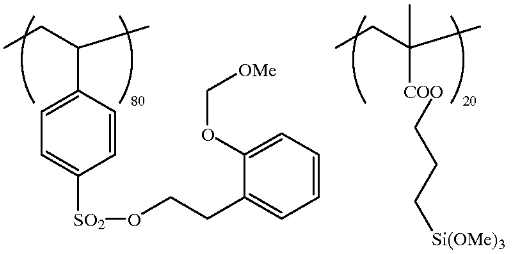

(I-8)

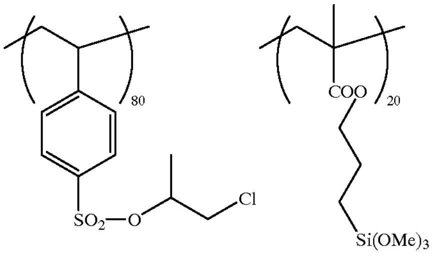

(I-9)

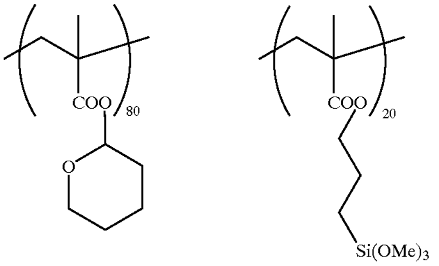

-continued (I-10)

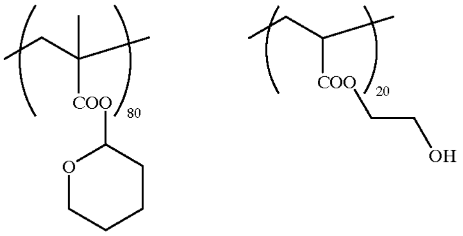

(I-11)

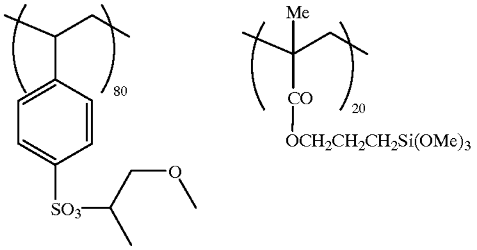

(I-12)

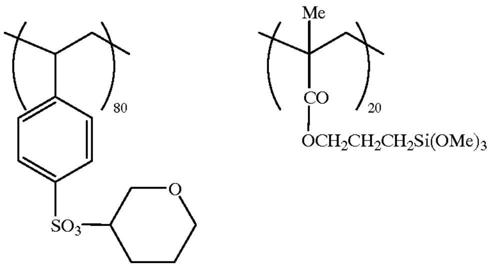

(I-13)

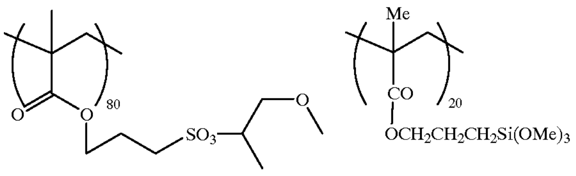

(I-14)

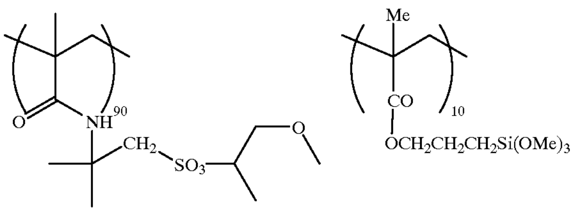

-continued (I-15)

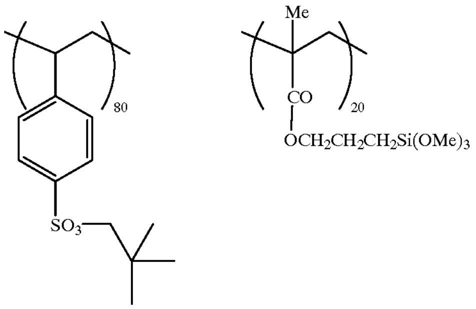

(I-16)

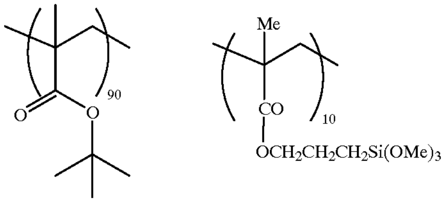

(I-17)

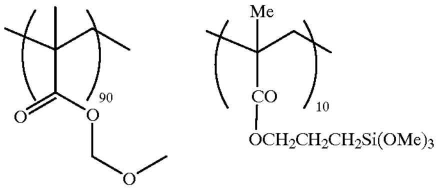

[Hydrolytic Polymerizable Compound]

The hydrolytic polymerizable compound used in the present invention is the compound represented by the following formula (1);

$$(R_1)_n\text{—}X\text{—}(OR_2)_{4-n} \quad (1)$$

wherein $R_1$ and $R_2$, which may be the same or different, each represents an alkyl group or an aryl group; X represents Si, Al, Ti, or Zr; and n represents an integer of from 0 to 2. When $R_1$ or $R_2$ represents an alkyl group, the carbon atom number of the alkyl group is preferably from 1 to 4. Also, the alkyl group or the aryl group may have a substituent. In addition, the compound is a low-molecular weight compound and the molecular weight of the compound is preferably not more than 1000.

Examples of the hydrolytic polymerizable compound containing aluminum therein include trimethoxy aluminate, triethoxy aluminate, tripropoxy aluminate, and tetraethoxy aluminate.

Examples of the hydrolytic polymerizable compound containing titanium therein include trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate. Examples of the hydrolytic polymerizable compound containing zirconium include the zirconates corresponding to the above-described titanates.

Examples of the hydrolytic polymerizable compound containing silicon therein include trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, and diphenyldiethoxysilane. Of these compounds, particularly preferable compounds include tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane, diphenyldiethoxysilane, and the like.

The hydrolytic polymerizable compounds described above may be used singly or as a mixture of two or more kinds. Also, after being partially hydrolyzed, the product may be subjected to dehydrocondensation, In addition, to control the properties of the product, if necessary, a trialkylmonoalkoxysilane can be added thereto. The hydrolytic polymerizable compound is a compound for constituting an inorganic phase in the image-forming material of the present invention and to increase storage stability of the image-forming material in a solution state before the coating thereof on the substrate of the planographic original plate, it is effective to protect the active metal hydroxide group such as, for example, a silanol group (Si—OH) of the inorganic polymer formed by the partially hydrolytic polymerization of the hydrolytic polymerizing compound. The protection of the silanol group can be achieved by esterifying the silanol group with a higher alcohol such as t-butanol, t-propyl alcohol, and the like. Specifically, by adding the above-described higher alcohol to the inorganic phase, the protection can be practiced. In this case, according to the property of the inorganic phase, for example, by dehydrating the inorganic phase by means of distilling off water eliminated from the inorganic phase by heating, storage stability can be improved. When an acid or a base, which can become a catalyst for the hydrolytic polymerization, exists in the inorganic phase, it is generally effective to lower the concentration thereof. This can be easily practiced by neutralizing the inorganic phase with an acid or a base.

Also, in the present invention, in place of or together with the hydrolytic polymerizable compound represented by the above-described formula (1) and a compound which changes to that of a hydrophilic property such as sulfonic ester, a hydrolytic polymerizable compound represented by following formula (1-S) can be used. The compound shown by the formula (1-S) is the compound of the above-described formula (1), wherein X is Si, introduced with an acid generating group.

$(R^2)_1(OR^3)_{3-1}$—Si—L—$(SO_3R^1)_m$(1—S)

wherein $R^1$ represents an alkyl group, an aryl group, or a cyclic imide group; $R^2$ and $R^3$, which may be the same or different, each represents an alkyl group or an aryl group; L represents a divalent or trivalent organic linkage group; 1 represents an integer from 0 to 2; and m represents 1 or 2.

That is, wherein $R^1$ and L have the same meanings as $R^1$ and L of the formula (2) in the explanation of the above-described functional group and the groups illustrated above can be applied.

$R^1$ and $R^3$, which may be the same or different, include the same groups illustrated as $R^1$, and are preferably an alkyl group having from 1 to 10 carbon atoms or an aryl group having from 6 to 20 carbon atoms.

Also, 1 represents an integer of from 0 to 2 and m represents an integer of 1 or 2.

The molecular weight of the compound shown by the formula (1-S) is not more than 2000, and preferably not more than 1000.

Preferable examples (S-1) to (S-24) of the compound shown by the above-described formula (1-S) are shown below, but the invention is not limited to these practical examples.

S-1

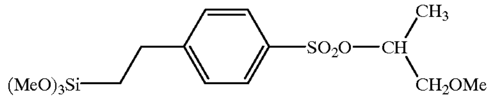

S-2

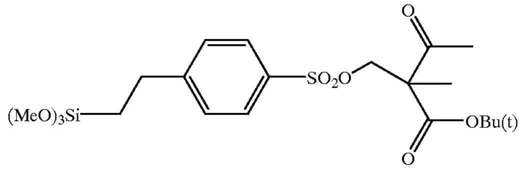

S-3

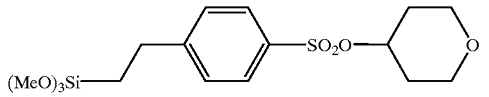

S-4

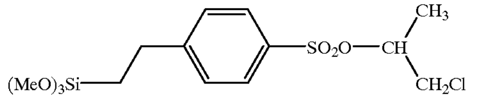

S-5

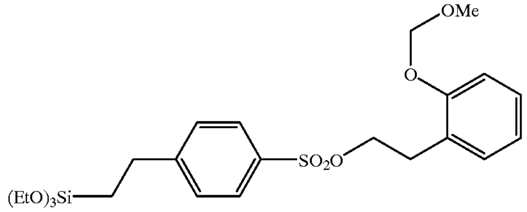

S-6

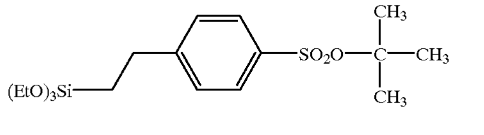

S-7

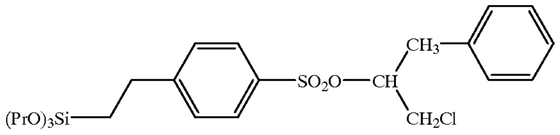

S-8

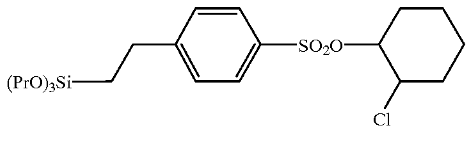

-continued

S-9

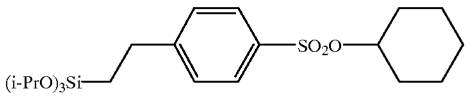

S-10

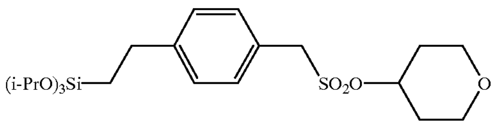

S-11

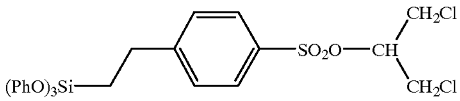

S-12

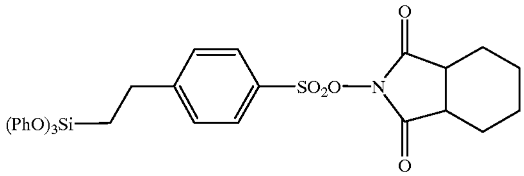

S-13

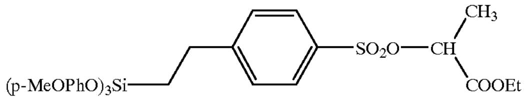

S-14

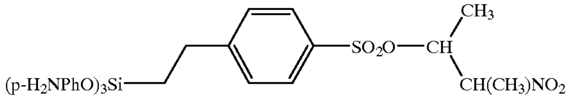

S-15

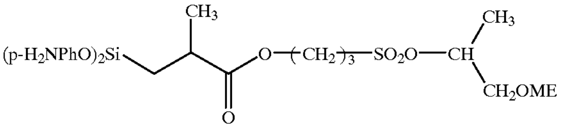

S-16

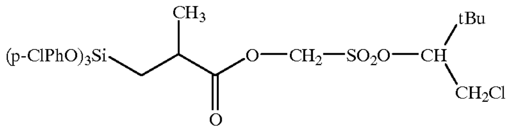

S-17

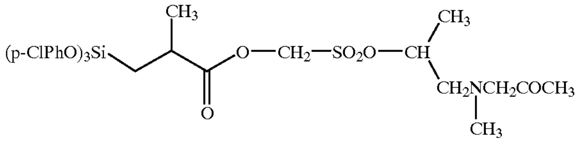

S-18

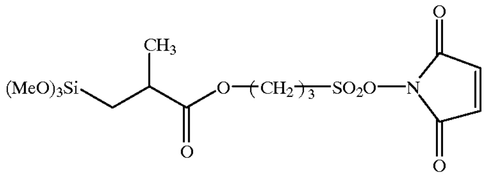

-continued

S-19

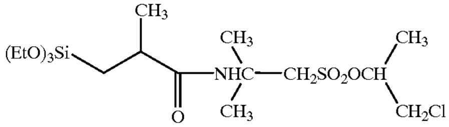

S-20

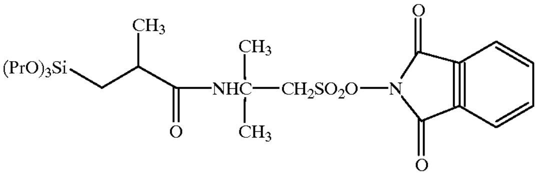

S-21

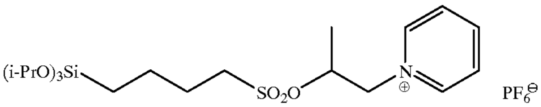

S-22

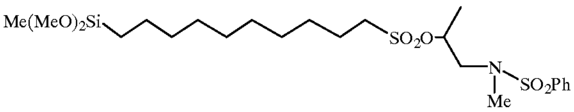

S-23

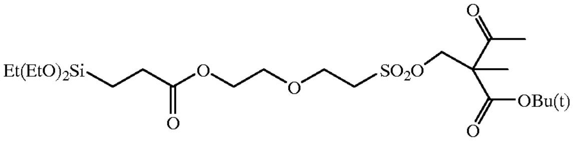

S-24

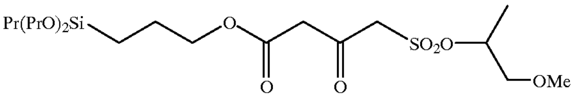

When the compound represented by the above-described formula (1-S) is used in the photosensitive planographic printing plate of the present invention, the compound causes hydrolytic condensation during preparation of a coating solution or during coating and becomes a resin having an $SO_3R^1$ group at the terminal. When the resin absorbs an energy from radiation, and the like, the $SO_3R^1$ group is decomposed. Also, the portion wherein the $SO_3R^1$ group is decomposed to become hydrophilic imagewise by the heat from a heating means or by an acid from a photo acid generating means. Accordingly, using the photosensitive planographic printing plate of the present invention, after image formation, printing is possible without need for a development process and desired prints are obtained. The photosensitive planographic printing plate of the present invention is excellent in the press run. It is considered that because the hydrolytic polymerizable composition has a group corresponding to the functional group X having a function of changing from a hydrophobic property to a hydrophilic property by heating the compound or by the action of an acid in the molecule, by using the compound, the effect of the present invention is further improved. Also, when the compound shown by the formula (1-S) is used together with the compound shown by the formula (1), wherein X is Si, a better effect is obtained.

In the first aspect of the present invention, the above-described hydrolytic polymerizable compound (the compound shown by the formula (1) or the sum of the compound of the formula (1) and the compound shown by the formula (1-S) used together) is used in the range of preferably from 3 to 95% by weight, and more preferably from 10 to 80% by weight of the total solid components of the photosensitive layer of the radiation-sensitive planographic printing plate.

On the other hand, in the second aspect of the present invention, the above-described hydrolytic polymerizable compound is used in the range of preferably from 5 to 95% by weight, andmore preferably from 20 to 80% by weight of the total solid component of the photosensitive layer of the radiation-sensitive planographic printing plate.

Compound B

Next, the compound B used for the second aspect of the present invention will be explained.

The compound B is a compound having "at least one functional group selected from a sulfonic acid ester group, a disulfone group, a sulfonimide group, and an alkoxyalkyl ester group", that is the functional group X (the functional group is also referred to simply as "functional group X" in the second aspect of the present invention) in the compound A used in the first aspect of the present invention as described above. The functional group X in the compound B is the same as the group described in the above-described compound A. Also, the functional group X has a function of changing the compound B from hydrophobic to hydrophilic by heating or the action of an acid as is the case with the compound A and the consideration about the water droplet contact angle in air is the same as is the case with the compound A described above.

As this type of compound B, a high molecular weight compound obtained by radical polymerizing at least one polymer having functional group(s) represented by any of the above-described formulae (2) to (5) is preferably used. As such a high-molecular weight compound, a homopolymer using only one kind of the monomer having the functional group(s) represented by any of the formulae (2) to (5) may be used but a copolymer using two or more kinds of monomer or a copolymer of the above-described monomer and another monomer may be used. The other monomers are the same as those described in regard to the compound A used for the above-described first aspect of the present invention. The ratio of the monomer having the functional group(s) represented by any of the formulae (2) to (5) used for the synthesis of the copolymer to the whole monomer is preferably from 5 to 99% by weight, and more preferably from 10 to 95% by weight.

Specific examples of the compound B used for the second aspect of the present invention are illustrated below.

(I-1)

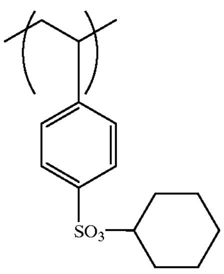

-continued (I-2)

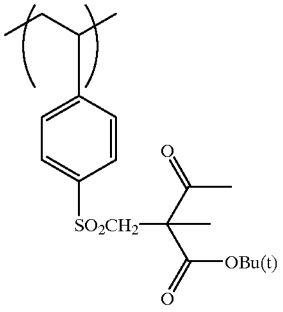

(2-1)

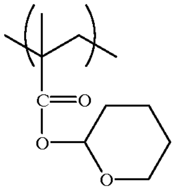

[Solid Particles]

Next, at least one kind of solid particle selected from inorganic particles, organic particles, and metal particles, which comprise the 3 rd aspect of the present invention will be explained.

The solid particles are preferably a granular material having good affinity with and good adhesion to the above-described compound forming the photosensitive layer. The solid particles may be surface-treated to improve the dispersibility thereof. These solid particles may be used singly or in a mixture of two or more kinds and, further, a suitable combination of inorganic particles, metal particles, and organic particles may be used.

As the inorganic particles, for example, metal oxides such as zinc oxide, titanium dioxide, iron oxide, zirconia, and the like; silicon-containing oxides, which are called white carbon and have no absorption in the visible region, such as silicic acid anhydride, hydrated calcium silicate, hydrated aluminum silicate, and the like; and clay mineral particles such as clay, talc, kaolin, zeolite, and the like, can be used. As the metal particles, particles of, for example, aluminum, copper, nickel, silver, and iron can be used. The inorganic particles and the metal particles have a mean particle size of not larger than 10 μm, preferably from 0.01 to 10 μm, and more preferably from 0.1 to 5 μm. When the mean particle size of the inorganic particles or the metal particles is smaller than 0 .01 μm, the water-holding property of a laser-irradiated portion is insufficient and background stains are liable to form. On the other hand, when the mean particle size exceeds 10 μm, the resolution of the print is reduced, the adhesion with the support becomes poor, and the particles near the surface of the photosensitive layer are liable to be released.

The inorganic particles or the metal particles are incorporated in the recording layer in the amount of from 2 to 90% by volume, preferably from 5 to 80% by volume, and more preferably from 10 to 50% by volume of the whole composition. When the content of the particles is less than 2% by volume, the water-holding property in the laser-irradiated portion of the recording layer surface is insufficient and background stains are liable to form. When the content exceeds 90% by volume, the strength of the recording layer is reduced, adversely affecting the press run and also the adhesion between the support and the recording layer is lowered.

As the particles, organic particles can also be used in addition to the inorganic particles or the metal particles.

There is no particular restriction on the organic particles if the particles increase the water-holding property and resin particles can be used as the organic particles. It is necessary, however, to pay attention to the following points when using resin particles. Namely, when a solvent is used for dispersing resin particles, it is necessary to select resin particles which are not dissolved in the solvent or to select a solvent which does not dissolve the resin particles. Also, when the resin particles are dispersed by a thermoplastic polymer and heat, it is necessary to select the resin particles which are not melted, not deformed, and not decomposed by the heat for dispersing the resin particles.

As resin particles having these characteristics, cross-linked resin particles can be preferably used. The mean particle size of the organic particles is from 0.01 to 10 μm, preferably from 0.05 to 10 μm, and more preferably from 0.1 to 5 μm. When the mean particle size of the organic particles is smaller than 0.01 μm, the water-holding property of the laser-irradiated portion is insufficient and background stains are liable to form and when the mean particle size exceeds 10 μm, the resolution of the print is reduced, the adhesion with the support is poor, and the particles near the surface are liable to be released.

The organic particles are incorporated in the recording layer in an amount of from 2 to 90% by volume, preferably from 5 to 80% by weight, and more preferably from 10 to 50% by weight of the whole composition. When the content of the particles is less than 2% by volume, the water-holding property at the laser-irradiated portion of the recording layer surface is insufficient and background stains are liable to form. While when the content exceeds 90% by volume, the strength of the recording layer is reduced, adversely affecting the press run and also the adhesion between the support and the recording layer is lowered.

Examples of the organic particles include polystyrene particles (particle size of from 4 to 10 μm) and silicone resin particles (particle size of from 2 to 4 μm), and the like. The cross-linked resin particles include, for example, a micro gel (particle size of from 0.01 to 1 μm) made up of two or more kinds of ethylene unsaturated monomers, cross-linked resin particles (particle size of from 4 to 10 μm) made up of styrene and divinylbenzene, and cross-linked resin particles (particle size of from 4 to 10 μm) made up of methyl methacrylate and diethylene glycol dimethacrylate, that is, the micro gel of an acrylic resin, cross-linked polystyrene, and cross-linked methyl methacrylate. These particles are prepared by a general method such as an emulsion polymerization method, a soap-free emulsion polymerization method, a seed emulsion polymerization method, a dispersion polymerization method, a suspension polymerization method, and the like.

Also, inorganic particles can be prepared from a solution. For example, a metal lower alkoxide is added to a solvent such as ethanol and in the existence of water and an acid or an alkali, inorganic particles containing such metal are obtained. By adding the inorganic particle solution obtained to a solution of a solvent-soluble thermoplastic polymer, an inorganic particle dispersion can be prepared. Alternatively, after first adding the metal lower alkoxide to the thermoplastic polymer solution, water and an acid or an alkali are added thereto and the inorganic particles containing the metal can be obtained.

In the case of preparing inorganic particles by adding the metal lower alkoxide to a solution of the precursor for a thermoplastic polymer, when the thermoplastic polymer is formed by heating the polymer precursor, a composite of the polymer and an inorganic material is obtained. As the metal lower alkoxide, tetraethoxysilane, tetraethoxy titanium, and the like, can be used.

Also, it has been confirmed that, in the present invention, as the water-insoluble particles, by using particles having a so-called light-heat conversion action of converting radiation energy to heat or the characteristics of initiating a self exothermic reaction using heat as a trigger, sufficient and lasting heat energy for accelerating the discrimination of image portions and non-image portions is supplied, whereby the above-described effect is improved.

According to the embodiment, because the above-described composition covers the surface of the water-insoluble particles as a binder, heat is easily supplied from the particles, and the heat is not only supplied from the simple light-heat conversion but also the heat is continually supplied by the self exothermic reaction of the particles using the heat from the light-heat conversion as a trigger, whereby the change from a hydrophobic property to a hydrophilic property is effectively performed.

In this case, the heat obtained from the light-heat conversion may have a quantity of heat sufficient for obtaining the increase in temperature for initiating the chemical and/or physical change and, because continuation of the change thereafter is obtained by the continuation of the self exothermic reaction, a large amount of heat energy provided instantly is not required, and thus, in addition to the improvement of the discrimination faculty of imaged portions and non-imaged portions, a high sensitivity is easily obtained, and also reduction in resolution due to heat conduction, which is liable to occur when relying on the light-heat conversion only, is suppressed.

Of course, the heat energy converted by the light-heat conversion mechanism does not exceed the value of the initial light energy. Accordingly, the problem that, in many cases, because the heat energy itself is small or the supply of heat is limited to cases where exposure is performed by radiation, the heat energy is insufficient to cause the chemical reaction and the physical change required for image recording, can be solved by using the specific particles.

Next, the s elf exothermic reaction will be explained. In the present invention, self exothermic reaction means the exothermic chemical reaction occurring using the heat energy generated by the light-heat conversion action as reaction-initiating energy. The reaction heat released in accordance with the chemical reaction maintains its own chemical reaction, whereby a kind of an energy amplification takes place which causes the physical or chemical change which discriminates the image portions and the non-image portions. When, for example, metallic iron is used as the self exothermic reaction substance, the heat energy is about 400 kJ per mole. Also, so far as the self exothermic reaction occurs as the result of the light-heat conversion, the particles generating the initiation energy by the light-heat conversion are not necessarily the same as in the reaction substance system which carries out the self exothermic reaction using heat.

Whether or not the self exothermic reaction occurs can be easily confirmed by a differential thermal balance (TG/DTA). When a self exothermic reaction substance is inserted in a differential thermal balance and the temperature is raised at a constant rate, an exothermic peak appears at a particular temperature, and the occurrence of an exothermic reaction is observed. When the oxidation reaction of a metal or a lower metal oxide is used as the self exothermic reaction, an exothermic peak appears and an increase in weight is similarly observed from the thermal balance.

As such particles, a substance or a substance system which absorbs radiation to covert it to heat and using this heat to initiate the self exothermic reaction can be used.

As the self exothermic reaction which discriminates image portions and non-image portions, there are chemical reactions such as an esterification reaction, a curing reaction, a polymerization reaction, a depolymerization reaction, and the like, and reactions in which physical changes such as abrasion, film softening, and the like are caused. Also, as the images formed, there are cases of positive images and cases of negative images according to the substance or the substance system utilized.

Among the water-insoluble particles which absorb radiation to covert it to heat and use this heat to initiate the self exothermic reaction as described above, the particularly preferable substances are metal particles or metal compound particles and they constitute a self exothermic reaction system by combining with oxygen in air. Specifically, the preferred substances are metals and compounds such as metal oxides, metal nitrides, metal sulfides, metal carbides, and the like.

The metals include Mg, Al, Si, Ti, V, Cr, Mn, Fe, Co, Ni, Cu, Zn, Ga, Ge, Y, Zr, Nb, Mo, Tc, Ru, Pd, Ag, Cd, In, Sn, Sb, Hf, Ta, W, Re, Os, Ir, Pt, Au, Pb, and the like. Among these metals, metals which easily cause an exothermic reaction such as an oxidation reaction, and the like, are preferred and specifically, Al, Si, Ti, V, Cr, Mn, Fe, Co, Ni, Cu, Zn, Y, Zr, Mo, Ag, In, Sn, and W are preferred. Further, as metals whose radiation absorption efficiency is high and whose self exothermic reaction heat energy is large, Fe, Co, Ni, Cr, Ti, and Zr are preferred.

The particles may be composed of not only a metal simple substance but also of two or more kinds of metals. Furthermore, the particles may be composed of a metal and a metal compound such as a metal oxide, a metal nitride, a metal sulfide, a metal carbide, and the like. The metal simple substance gives more heat energy from a self exothermic reaction such as oxidation, and the like, but handling thereof in air is complicated and when such a metal simple substance is brought into contact with air, there is a danger of causing spontaneous ignition. Thus, a metal which is covered with a metal compound such as a metal oxide, a metal nitride, a metal sulfide, a metal carbide, and the like, of a thickness of several nm from the surface is preferred.

The metal compound covering the metal particles may be particles or a thin film such as a vapor-deposited film but when using the metal particles together with an organic material, particles are preferable. In this case, the size of the particles is not larger than 10 $\mu$m, preferably from 0.005 to 5 $\mu$m, and more preferably from 0.01 to 3 $\mu$m. When the particle size is smaller than 0.01 $\mu$m, the dispersion of the particles is difficult and when the particle size is larger than 10 $\mu$m, the resolution of the print is reduced.

Among the above-described metal fine powder of the present invention, an iron powder is preferable. Any iron powder is preferable but among these powders, the powder of an iron alloy having $\alpha$-Fe as the main constituent is preferred. These powders may contain, in addition to the predetermined atoms, other atoms such as Al, Si, S, Sc, Ca, Ti, V, Cr, Cu, Y, Mo, Rh, Pd, Ag, Sn, Sb, Te, Ba, Ta, W, Re, Au, Hg, Pb, Bi, La, Ce, Pr, Nd, P, Co, Mn, Zn, Ni, Sr, B, and the like. In particular, it is preferable that the fine powder contains at least one of Al, Si, Ca, Y, Ba, La, Nd, Co, Ni, and B in addition to the $\alpha$-Fe and it is more preferable that it contain at least one of Co, Y, and Al. The amount of Co relative to Fe is preferably from 0 to 40 atomic % inclusive, more preferably from 15 to 35 atomic % inclusive, and still more preferably from 20 to 35 atomic % inclusive. The amount of Y is preferably from 1.5 to 12 atomic % inclusive, more preferably from 3 to 10 atomic % inclusive, and still more preferably from 4 to 9 atomic % inclusive. The amount of Al is preferably from 1.5 to 12 atomic % inclusive, more preferably from 3 to 10 atomic % inclusive, and still more preferably from 4 to 9 atomic % inclusive. The iron alloy powder may further contain a small amount of a hydroxide or an oxide. Specifically, these are described in Japanese Patent Publication Nos. 44-14090, 45-18372, 47-22062, 47-22513, 46-28466, 46-38755, 47-4286, 47-12422, 47-17284, 47-18509, 47-18573, 39-10307, and 46-39639, and U.S. Pat. Nos. 3,026,215, 3,031,341, 3,100,194, 3,242,005, and 3,389,014.

The specific surface area of the iron alloy powder used in the present invention according to the BET method is from 20 to 80 $m^2/g$, and preferably from 40 to 60 $m^2/g$. When the specific surface area is 20 $m^2/g$ or less, the surface properties are deteriorated, and when the specific surface area is 80 $m^2/g$ or more, the dispersibility is undesirably reduced. The crystallite size of the iron alloy powder of the present invention is from 350 to 80 Å, preferably from 250 to 100 Å, and more preferably from 200 to 140 Å. The long axis length of the powder is from 0.02 to 0.25 $\mu$m inclusive, preferably from 0.05 to 0.15 $\mu$m inclusive, and more preferably from 0.06 to 0.1 $\mu$m inclusive. The acicular ratio of the powder is preferably from 3 to 15 inclusive, and more preferably from 5 to 12 inclusive.

When a metal oxide is used as the particles, there are cases where the metal oxide itself performs the light-heat conversion and gives reaction initiation energy to a reaction substance system causing the self exothermic reaction and cases where the metal oxide itself is a lower oxide of a multivalent metal and the oxide itself is the light-heat conversion substance as is the case with the above-described metal powder, and also is a self exothermic type air oxidation reaction substance.

The former is a light-absorptive heavy metal oxide and examples include oxides of Fe, Co, Ni, and the like.

Examples of the latter include there ferrous oxide, tri-iron tetroxide, titanium monoxide, stannous oxide, chromous oxide, and the like. In particular, the latter, that is, the lower metal oxides are preferred and among these oxides, ferrous oxide, tri-iron tetroxide, and titanium monoxide are preferred.

When the substance or the substance system constituting the particles is a metal nitride, the preferred metal nitride is an azide compound of a metal. In particular, the azide compounds of copper, silver, and tin are preferred. These azide compounds generate heat by causing photodecomposition and thereafter cause a thermal decomposition reaction.

When the substance or the substance system constituting the above-described particles is a metal sulfide, the preferred metal sulfide is a heavy metal sulfide such as the sulfide of radiation-absorptive transition metal. The preferred sulfides are silver sulfide, ferrous sulfide, and cobalt sulfide and when using these sulfides, a substance system containing a simple substance sulfur and a self exothermic reaction substance such as an alkali carbonate is used.

It is also preferable that, as the particles, surface-modified particles, in which a group whose properties are changing from hydrophobic to hydrophilic due to radiation or heat is bonded to the surface of the solid particles, are used. Such surface-modified particles are particles having on the surfaces thereof the above-described function of a binder and are effective for improving the hydrophilicization of the radiation-irradiated portions of the photosensitive layer containing the above-described solid particles, in other words, for improving the sensitivity.

As the above-described group whose properties change from hydrophobic to hydrophilic by radiation or heat, there is a group represented by the following formula (2)

$$—L—SO_3R^1 \quad (2)$$

wherein $R^1$ has the same meaning as explained above for "functional group X".

The surface-modified particles, wherein the group shown by the formula (2) whose properties change from hydrophobic to hydrophilic by radiation or heat is bonded to the surface of the particles, are a reaction product of the solid particles and a silane coupling agent represented by the following formula (1-S);

$$(R^2)_l(OR^3)_{3-l}—Si—L—(SO_3R^1)_m \quad (1\text{-}S)$$

The silane coupling agent shown by the formula (1-S) is the same as the hydrolytic polymerizable compound as explained above for “compound A”, and the like.

The solid particles which become the base when preparing the surface-modified solid particles may be any particles which have the property of reacting with the silane coupling agent shown by the formula (1-S). Preferable examples include silica, alumina, titanium dioxide, carbon black, and the like. The mean size of the solid particles is not larger than 10 μm, preferably from 0.01 to 10 μm, and more preferably from 0.1 to 5 μm. When the mean particle size of the solid particles is less than 0.01 μm, the water-holding property of the laser-irradiated portion is insufficient and background stains are liable to form. When the mean particle size is larger than 10 μm, the resolution of the print is deteriorated, the adhesion to the support becomes stronger, and the particles near the surface are liable to be released.

The solid particle modifying method will now be explained using silica fine particles as an example.

The surface-modified silica fine particles whose surfaces were modified with the above-described silane coupling agent can be produced by a conventionally known surface modifying method. Specifically, the particles can be synthesized according to the methods described in Noboru Suzuki, Nobuko Yuzawa, Atsushi Endo, and Hiroshi Utsuki, “*Shikizai* (Coloring Materials)”, Vol. 57, 429(1984); Hiroshi Yoshioka and Masayuki Ikeno, “*Hyomen* (Surfaces)” Vol. 21, 33(1983); Hiroshi Utsuki, “*Hyomen* (Surfaces)”, Vol. 16, 525(1978); K. Tanaka, et al., *Bull. Chem. Soc.* Jpn., Vol. 53, 1242(1980); M. L. Hair and W. Hertl, *J. Phys. Chem.,* Vol. 77, 1965(1973); Ya. Davydov., et al., *Chromatographia,* Vol. 14, 13(1981); K. Unger, et al., *Colloid Polym. Sci.,* Vol. 252, 317(1974); R. Burwell and O Leal, *J. Chem. Soc. Chem. Commun.,* 342(1974); W. Stoeber, *Kolloid Z.,* Vol. 149, 39(1956); Franz. Pat. 1368765; DAS 1163784, and the like, and the literature and patents cited therein.

The preferable size of the silica gel particles is in the range of from about 1 to 2000 nm and specific examples include Cylisia 350 (particle size 1800 nm silica), made by Fuji Silicia Kagaku K.K.; Snowtex OL (particle size 45 nm silica 20% colloid aqueous solution), made by Nissan Chemical Industries, Ltd.; AEROSIL 130 (particle size 16 nm silica) made by Nippon Aerosil K.K.; Mizukasil P-527U (particle size 60 nm silica), made by Mizusawa Kagaku Kogyo K.K., and the like.

It is preferred that the surface-modified particles are cross-linked with a cross-linking agent. As the cross-linking agent used in this case, the hydrolytic polymerizable compound represented by the above-described formula (1) is suitable.

The silica fine particles surface-modified by the silane coupling agent shown by the formula (1-S) and the cross-linking agents shown by the formula (1) each may be used singly or as a mixture of two or more kinds. Also, the compound of the formula (1) may be subjected to dehydrocondensation after being partially hydrolyzed.

Now, the schemes of several courses for forming the water-insoluble structure comprised of the water-insoluble particles and the material having the above-described specific functional group, that is, the photosensitive layer having voids therein, are illustrated below using the following schematic systems.

1

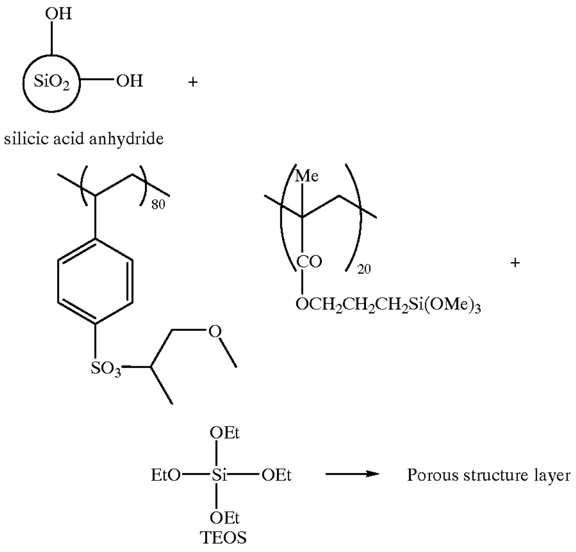

2

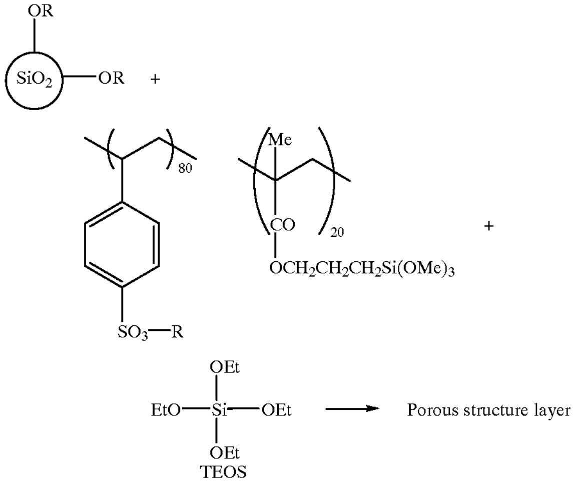

3

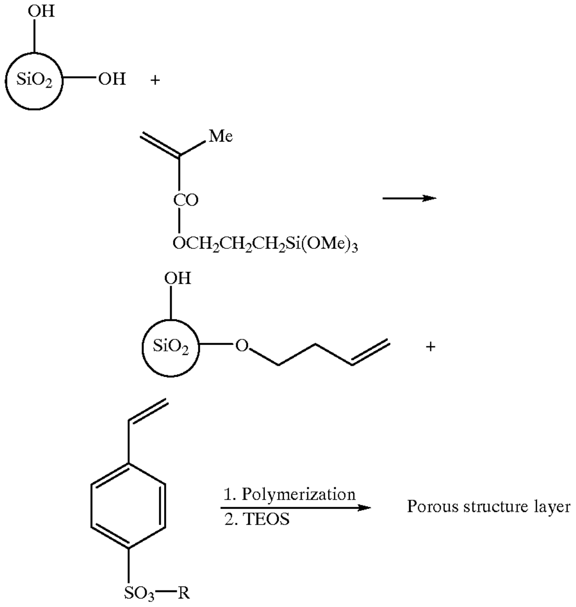

-continued

4

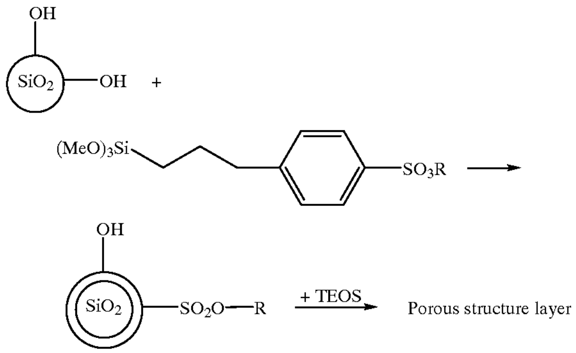

5

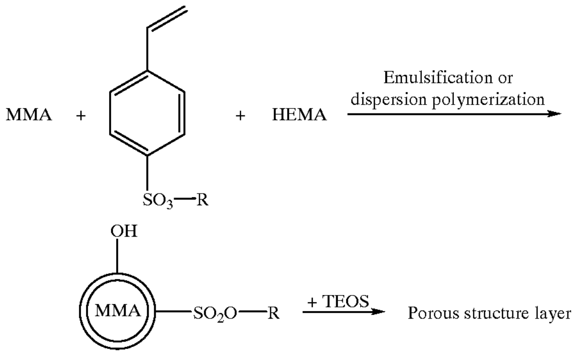

MMA: Methyl methacrylate
HEMA: Hydroxyethyl methacrylate

In the schematic systems, the schemes 1 and 2 are examples of forming a layer of a porous structure by simultaneously interpolating the specific compound (composition) and the solid particles, with scheme 1 being when silica particles are used as the solid particles and scheme 2 being when previously surface-modified silica particles are used as the solid particles. In addition, in the schematic systems, R simply means a substituent such as a modification group for each compound or solid and each R may in some cases be different.

Schemes 3 and 4 are examples that after previously causing a silane coupling agent (for example, the compound of the formula (1-S)) to act with silica particles, a hydrolytic polymerizable compound, which may be different from the silane coupling agent, is added to carry out the reaction for forming a porous structure and in scheme 3, a polymerizable monomer is modified to the surfaces of the particles.

In scheme 5, organic polymer particles are first formed by emulsification or dispersion copolymerization.

More specifically, in scheme 3, a polymerizable group is introduced onto the surfaces of the particles using a silane coupling agent, thereafter, a compound having a sensitive group and particles having a reactivity-sensitive group are prepared, and then a porous layer is formed using the hydrolytic polymerizable compound.

In scheme 4, sensitive particles are directly formed using a silane coupling agent and thereafter, a porous layer is formed using the hydrolytic polymerizable compound.

In the present invention, any embodiments described above can be employed but the method of forming the photosensitive layer having voids therein using water-insoluble particles is not limited to these embodiments.

[Acid generating means]

In the radiation-sensitive planographic printing plate of the present invention, for reacting the above-described compound A or compound B by imagewise generating an acid, it is desirable to add an acid generating agent as the acid generating means. However, the above-described compound A or compound B itself sometimes generates an acid by heat and shows a function as an acid generating agent and because, in such cases, images can be formed without using another acid generating agent, an acid generating agent is unnecessary.

The acid generating agent used in the present invention can be selected from known compounds generating an acid by the action of light or heat as the acid generating agent.

Examples of these compounds include onium salts such as diazonium salts described in S. I. Schlesinger, *Photogr. Sci. Eng.,* Vol. 18, 387(1974), T. S. Bal, et al., *Polymer,* Vol. 21, 423(1980), and the like.; ammonium salts described in U.S. Pat. Nos. 4,069,055 and 4,069,056, Japanese Patent Laid Open No. 3-140140, and the like.; phosphonium salts described in D. C. Necker, et al., *Macromolecules,* Vol. 17, 2468(1984), C. S. Wen, et al., *Teh. Proc. Conf. Rad. Curing ASIA,* page 478, Tokyo, October (1988), U.S. Pat. Nos. 4,069,055 and 4,069,056, and the like.; iodonium salts described in J. V. Crivello, et al., *Macromolecules,* Vol. 10(6), 1307(1977), *Chem. & Eng. News,* No. 28, 31(1988), European Patent No. 104,143, Japanese Patent Laid Open Nos. 2-150848 and 2-296514, and the like.; sulfonium salts described in J. V. Crivello, et al., *Polymer J.,* Vol. 17, 73(1985); J. V. Crivello, et al., *J. Org. Chem.,* Vol. 43, 3055(1978), W. R. Watt, et al., *J. Polymer Sci., Polymer Chem. Ed.,* Vol. 22, 1789(1984), J. V. Crivello, et al., *Polymer Bull.,* Vol. 14, 279(1985) J. V. Crivello, et al., *Macromolecules,* Vol. 14(5), 1141(1981), J. V. Crivello, et al., *J. Polymer Sci., Polymer Chem. Ed.,* Vol. 17, 2877 (1919), European Patent No. 370,693, U.S. Pat. No. 3,902, 114, European Patent Nos. 233,567, 297,443, and 297,442, U.S. Pat. Nos. 4,933,377, 4,760,013, 4,734,444 and 2,833, 827, German Patent Nos. 2,904,626, 3,604,580, and 3,604, 581, and the like.; selenonium salts described in J. V. Crivello, et al., *Macromolecules,* Vol. 10(6), 1307(1977), J. V. Crivello, et al., *J. Polymer Sci., Polymer Chem. Ed.,* Vol. 17, 1047(1979); and arsonium salts described in C. S. Wen, et al., *Teh. Proc. Conf. Rad. Curing ASIA,* page 478, October (1988); organic halogen compounds described in U.S. Pat. No. 3,905,815, Japanese Patent Publication No. 46-4605, Japanese Patent Laid Open Mos. 48-36281, 55-32070, 60-239736, 61-169835, 61-169837, 62-58241, 62-212401, 63-70243 and 63-298339, and the like.; organometallic/organic halogen compounds described in K. Meier, et al., *J. Rad. Curing,* Vol. 13(4), 26(1986), T. P. Gill, et al., *Inorg. Chem.,* Vol. 19, 3007(1980), D. Astruc, *Acc. Chem. Res.,* Vol. 19(12), 377(1896), Japanese Patent Laid Open No. 2-161445, and the like.; photo acid generating agents having an o-nitrobenzyl type protective group described in S. Hayase, et al., *J. Polymer Sci.,* Vol. 25, 753(1987), E. Reichmanis et al., *J. Polymer Sci., Polymer Chem. Ed.,* Vol. 23, 1(1985), Q. Q. Zhu, et al ., *J. Photochem.,* 36, 85, 39, 317(1987), B. Amit, et al., *Tetrahedron Lett.,* (24), 2205 (1973), D. H. R. Barton, et al., *J. Chem. Soc.,* 3571(1965), P. M. Collins, et al., *J. Chem. Soc., Perkin I,* 1695(1975), M. Rudinstein, et al., *Tetrahedron Lett.,* (17), 1445(1975), J. W. Walker, et al., *J. Am. Chem. Soc.,* Vol. 110, 7170(1988), S. C. Busman, et al., *J. Imaging Technol.,* Vol. 11(4), 191 (1985), H. M. Houlihan, et al., *Macromolecules,* Vol. 21, 2001(1988), P. M. Collins, et al., *J. Chem. Soc., Chem. Commun.,* 532(1972), S. Hayase, et al., *Macromolecules,* Vol. 18, 1799(1985), E. Reichmanis, et al., *J. Electrochem. Soc., Solid State Sci. Technol.,* 130(6), F. M. Houlihan, et al., *Macromolecules,* Vol. 21, 2001(1988), European Patent Nos. 0,290,750, 046,083, 156,535, 271,851, and 0,388,343, U.S. Pat. Nos. 3,901,710 and 4,181,531, Japanese Patent Laid Open Nos. 60-198538 and 53-133022, and the like.; compounds such as iminosulfonates, and the like., which generate a sulfonic acid by causing photodecomposition described in M. Tunooka, et al., *Polymer Preprints Japan,* Vol. 35(8), G. Berner et al., *J. Rad. Curing,* Vol. 13(4), W. J. Mijs, et al., *Coating Technol.,* Vol. 55(697), 45(1983), Akzo, H. Adachi, et al, *Polymer Preprints,* Japan, Vol. 37(3), European Patent Nos. 0,199,672, 84,515, 199,672, 044,115, and 0,101,122, U.S. Pat. Nos. 4,618,564, 4,371,605, and 4,431,774, Japanese Patent Laid Open Nos. 64-18143 and 2-245756, Japanese Patent Application No. 3-140109, and the like. Disulfone compounds described in Japanese Patent Laid Open No. 61-166544; o-naphthoquinonediazido-4-sulfonic acid halides described in Japanese Patent Laid Open No. 50-36209 (U.S. Pat. No. 3,969,118); and o-naphthoquinonediazide compounds described in Japanese Patent Laid Open No. 55-62444 (British Patent No. 2,038, 801) and Japanese Patent Publication No. 1-11935.

Other acid generating agents used in this invention include cyclohexyl citrate, sulfonic acid alkyl esters such as p-acetaminobenzenesulfonic acid cyclohexyl ester, p-bromobenzenesulfonic acid cyclohexyl ester, and the like., and the alkylsulfonic acid esters shown by the following formula described in Japanese Patent Application No. 9-26878 filed by the present inventors.

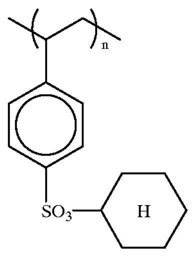

,

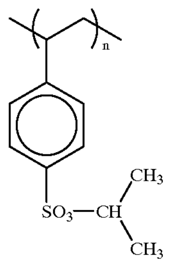

Among the above-described compounds which are decomposed by light, heat, or the irradiation of radiation so as to generate an acid, particularly effective compounds are described below.

(1) Oxazole derivatives represented by the following formula (PAG 1) or S-triazine derivatives represented by following formula (PAG 2) each substituted by a trihalomethyl group.

(PAG1)

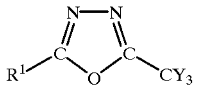

(PAG2)

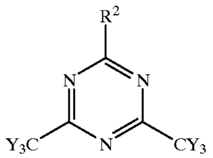

In the above formulae, $R^1$ represents a substituted or unsubstituted aryl or alkenyl group; $R^2$ represents a substituted or unsubstituted aryl, alkenyl, or alkyl group, or $—CY_3$; and Y represents a chlorine atom or a bromine atom.

Specifically, the following compounds may be used but the present invention is not limited to these compounds.

(PAG1-1)

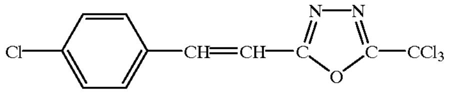

(PAG1-2)

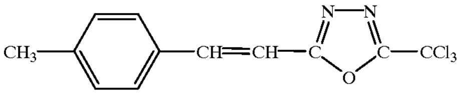

(PAG2-1)

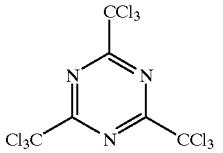

(PAG2-2)

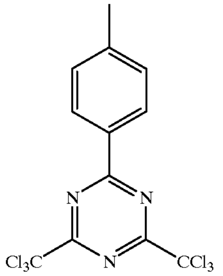

(PAG2-3)

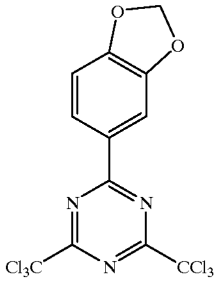

(PAG2-4)

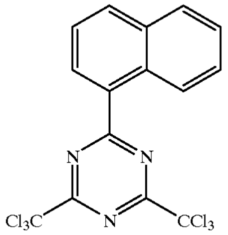

(PAG2-5)

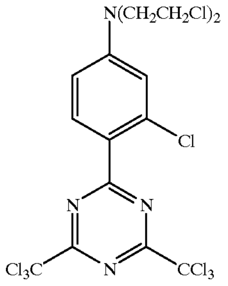

(2) Iodonium salts represented by the following formula (PAG 3) or sulfonium salts or diazonium salts represented by the following formula (PAG 4).

(PAG3)

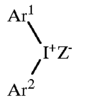

(PAG4)

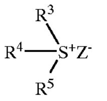

In these formulae, $Ar^1$ and $Ar^2$ each independently represents a substituted or unsubstituted aryl group. Examples of the preferred substituent include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

$R^3$, $R^4$, and $R^5$ each independently represents a substituted or unsubstituted alkyl or aryl group. Preferably, $R^3$, $R^4$, and $R^5$ each represents an aryl group having from 6 to 14 carbon atoms, an alkyl group having from 1 to 8 carbon atoms, or the substituted derivatives thereof. Examples of the preferred substituent include an alkoxy group having from 1 to 8 carbon atoms, an alkyl group having from 1 to 8 carbon atoms, a nitro group, a carboxyl group, a hydroxy group, and a halogen atom for the aryl group and include an alkoxy group having from 1 to 8 carbon atoms, a carboxyl group, and an alkoxycarbonyl group for the alkyl group.

$Z^-$ represents a counter anion and examples thereof include $BF_4^-$, $AsF_6^-$, $PF_6^-$, $SbF_6^-$, $SiF_6^{2-}$, $ClO_4^-$, a perfluoroalkanesulfonate anion such as $CF_3SO_3^-$, and the like., a pentafluorobenzenesulfonate anion, a bonded polynuclear aromatic sulfonate anion such as a naphthalene-1-sulfonate anion, an anthraquinonesulfonate anion, a dye having a sulfonic acid group, and the like, but is not limited to these compounds.

Further, two of $R^3$, $R^4$, and $R^5$, as well as $Ar^1$ and $Ar^2$, may combine via a single bond or a substituent.

Specific examples of these compounds are illustrated below but the present invention is not limited to these compounds.

(PAG3-1)

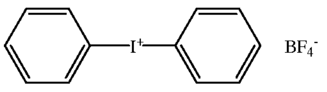

(PAG3-2)

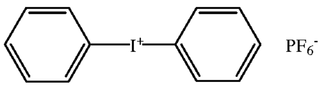

(PAG4-1)

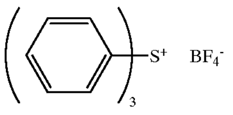

(PAG4-2)

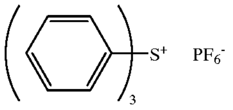

-continued (PAG4-3)

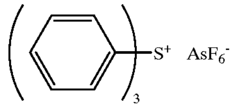

The onium compounds shown by the formulae (PAG 3) and (PAG 4) are known compounds and can be synthesized, for example, by the methods described in J. W. Knapczyk, et al., *J. Am. Chem. Soc.,* Vol. 91, 145(1969), A. L. Maycok, et al., *J. Org. Chem.* Vol. 35, 2532(1970), B. Goethas, et al., *Bull. Soc. Chem. Belg.,* Vol. 72, 546(1964), H. M. Leicester, *J. Am. Chem. Soc.,* Vol. 51, 3587(1929), J. V. Crivello, et al., J. Polym. Chem. Ed., Vol. 18, 2677(1980), U.S. Pat. Nos. 2,807,648 and 4,247,473, Japanese Patent Laid Open No. 53-101331, and the like.

(3) Disulfone derivatives represented by the following formula (PAG 5) or imonosulfonate derivatives represented by the following formula (PAG 6).

(PAG5)

$Ar^3—SO_2—SO_2—Ar^4$ (PAG6)

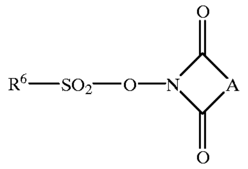

In these formulae, $Ar^3$ and $Ar^4$ each independently represents a substituted or unsubstituted aryl group; $R^6$ represents a substituted or unsubstituted alkyl or aryl group: and A represents a substituted or unsubstituted alkylene, alkenylene, or arylene group.

Practical examples of these compounds are shown below but the present invention is not limited to these compounds.

(PAG5-1)

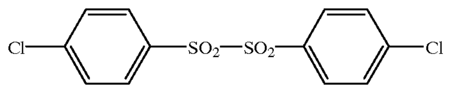

(PAG5-2)

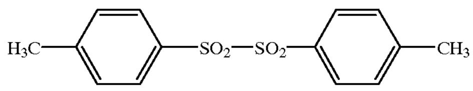

(PAG6-1)

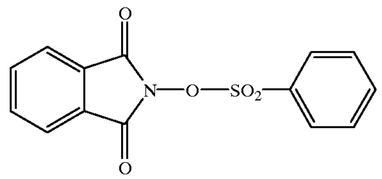

-continued (PAG6-2)

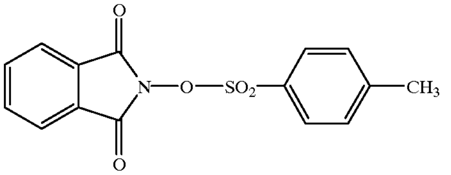

The content of the acid generating agent is usually in the range of from 0.1 to 30% by weight, and preferably from 1 to 15% by weight of the total solid components of the photosensitive layer of the radiation-sensitive planographic printing plate of the present invention. When the content is less than 1% by weight, the sensitivity is lowered, while when the content is larger than 15% by weight, there is a possibility the image strength will be decreased.

[Infrared Absorbent]

When the radiation-sensitive planographic printing plate of the present invention is used as a planographic original plate which forms images by the irradiation of infrared radiation, an infrared absorbent is added into the photosensitive layer of the radiation-sensitive planographic printing plate.

The infrared absorbent which is preferably used in the present invention is a dye or a pigment each of which effectively absorbs infrared rays having wavelengths of from 760 to 1200 nm and is more preferably a dye or a pigment having an absorption maximum in the wavelength range of from 760 to 1200 nm.

The dyes suitable for use in the present invention are commercially available dyes and known dyes described, for example, in "*Senryo Binran* (Handbook of Dyes)" edited by the Association of Organic Synthesis Chemistry, published 1970. Specific examples of the dyes include azo dyes, azo dyes in the form of metal complex salts, pyrazolone azo dyes, anthraquinone dyes, phthalocyanine dyes, carbonium dyes, quinonimine dyes, methine dyes, cyanine dyes, and dyes in the form of metal thiolate complexes.

Preferable examples of the dyes include cyanine dyes described, e.g., in Japanese Patent Laid Open Nos. 58-125246, 59-84356, 59-202829, and 60-78787; methine dyes described, e.g., in Japanese Patent Laid Open Nos. 58-173696, 58-181690, and 58-194595; naphthoquinone dyes described, e.g., in Japanese Patent Laid Open Nos. 58-112793, 58-224793, 59-48187, 59-73996, 60-52940, and 60-63744; squarylium dyes described in Japanese Patent Laid Open No. 58-112792, and cyanine dyes described in British Patent No. 434,875.

In addition, the near-infrared absorbing sensitizers described in U.S. Pat. No. 5,156,938 are suitably used and further, substituted arylbenzo(thio)pyrylium salts in U.S. Pat. No. 3,881,924, trimethinethiapyrylium salts described in Japanese Patent Laid Open 57-142645 (U.S. Pat. No. 4,327,169), pyrylium compounds described in Japanese Patent Laid Open Nos. 58-181051, 58-220143, 59-41363, 59-84248, 59-84249, 59-146063, and 59-146061; cyanine dyes described in Japanese Patent Laid Open No. 59-216146; pentamethinethiopyrylium salts described in U.S. Pat. No. 4,283,475; and pyrylium compounds described in Japanese Patent Publication Nos. 5-13514 and 5-19702 are preferably used.

In addition, other examples of the preferred dyes are the near-infrared absorbing dyes described in U.S. Pat. No. 4,756,993 as the formulae (I) and (II).

Among these dyes, cyanine dyes, squarylium dyes, pyrylium dyes, and nickel thiolate complexes are particularly preferred.

Pigments suitably used in the present invention are commercially available pigments and those described, for example, in "*Color Index Handbook* (*C.I.*)". "*Latest Pigment Handbook* (*Saishin Ganryo Binran*)" edited by Japan Association of Pigment Technology (Nippon Ganryo Gijyutsu Kyokai) published 1977, "*Latest Pigment Application Technologies* (*Saishin Ganryo Ooyo Gijyutsu*)", CMC, 1986 and "*Printing Ink Technologies* (*Insatsu Ink Gijyutsu*)", CNC. 1984.

Examples of the pigments include black pigments, yellow pigments, orange pigments, brown pigments, red pigments, purple pigments, blue pigments, green pigments, fluorescent pigments, metal powder pigments, and polymers containing chemically combined dyes. Specific examples of the pigments are insoluble azo pigments, azo lake pigments, condensed azo pigments, chelated azo pigments, phthalocyanine-based pigments, anthraquinone-based pigments, perylene- and perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, carbon black, and the like. Among these pigments, carbon black is preferred.

These pigments may be used without being surface-treated or may be used after being surface treated. Possible surface treatments include a treatment wherein a resin or a wax is coated on the surface of the pigments, a treatment wherein a surface active agent is adhered to the surface of the pigments, and a treatment wherein a reactive substance (e. g., a silane coupling agent, an epoxy compound, or a polyisocyanate) is bonded to the surface of the pigments. These surface-treating methods are described in "*Properties and Applications of Metal Soaps*" (Saiwai Shobo K.K.), "*Printing Ink Technologies*", CMC, 1984, and "*Latest Pigment Application Technologies*", CMC, 1986.

The diameter of the pigments is preferably from 0.01 to 10 μm, more preferably from 0.05 to 1 μm, and most preferably from 0.1 to 1 μm.

When the diameter is less than 0.01 μm, the dispersion stability of the pigment in the coating liquid of the photosensitive composition is insufficient, while when the diameter is larger than 10 μm, the uniformity of the image recording layer after coating thereof deteriorates.

A known dispersion technique using a dispersing machine employed in the preparation of inks and toners can also be used for the purpose of dispersing the pigment. Examples of the dispersion machine include an ultrasonic wave dispersing machine, a sand mill, an attritor, a pearl mill, a super mill, a ball mill, an impeller, a disperser, a KD mill, a colloid mill, a dynatron, a three-roll mill, a pressurized kneader, and the like. Details of these dispersing technique are described in "*Latest Pigment Application Technologies*", CMC, 1986.

The addition amounts of the dye and the pigment in the photosensitive layer are each in the range of from 0.01 to 50% by weight, and preferably from 0.1 to 10% by weight based on the total solid components of the composition constituting the photosensitive layer. Most preferably, the addition amount of the dye is in the range of from 0.5 to 10% by weight, while the addition amount of the pigment is in the range of from 1.0 to 10% by weight. When the addition amount is less than 0.01% by weight, the sensitivity of the photosensitive layer is lowered, while when the addition amount is more than 50% by weight, the non-imaged portions are liable to be stained at printing.

[Other Components]

In the present invention, the above-described components are used according to requirements and further, if necessary, various compounds may be added in addition to the above-described components.

For example, when the acid generating agent does not have a sensitivity in a visible region, sensitizing dyes for various acid generating agents are used for making the acid generating agents active under the light of the visible region.

Examples of these sensitizing dyes effectively used for the purpose include pyran dyes described in U.S. Pat. No. 5,238,782, cyanine dyes and squarylium-based dyes described in U.S. Pat. No. 4,997,745, merocyanine-based dyes described in U.S. Pat. No. 5,262,276, pyrylium dyes described in Japanese Patent Publication No. 8-20732 as well as Michler's ketone, thioxanthone, a ketocoumarin dye, and 9-phenylacridine. Other dyes that can be used are polynuclear aromatic compounds such as bisbenzilideneketone and 9, 10-diphenylanthracene described in U.S. Pat. No. 4,987,230.

As further examples of the other components, dyes having a large percentage of absorption in a visible region can be used as an image coloring agent.

Specific examples thereof include Oil Yellow No. 101, Oil Yellow No. 103, Oil Pink No. 312, Oil Green BG, Oil Blue BOS, Oil Blue No. 603, Oil Black BY, Oil Black BS, and Oil black T-505 (all manufactured by Orient Chemical Industries, Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the like, along with the dyes described in Japanese Patent Laid Open No. 62-293247 and Japanese Patent Application No. 7.-335145.

In addition, the addition amount thereof is from 0.01 to 10% by weight of the total solid components of the photosensitive layer of the radiation-sensitive planographic printing plate.

Further, into the photosensitive layer of the radiation-sensitive planographic printing plate of the present invention can be added the nonionic surface active agents described in Japanese Patent Laid Open Nos. 62-251740 and 3-208514 or the amphoteric surface active agents described in Japanese Patent Laid Open Nos. 59-121044 and 4-13149 for broadening the stability in the printing conditions.

Specific examples of the nonionic surface active agent include sorbitan tristearate, sorbitan monopalmitate, sorbitan trioleate, monoglyceride stearate, and poly-oxyethylene nonylphenyl ether.

Specific examples of the amphoteric surface active agent include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine (e.g., Amogen K, trade name, manufactured by Dai-ichi Kogyo Seiyaku Co., Ltd.).

The preferred addition amounts of the nonionic surface active agent and the amphoteric surface active agent are each in the range of from 0.05 to 15% by weight, and preferably from 0.1 to 5% by weight based on the weight of the total solid components of the image-forming material.

Furthermore, if necessary, a plasticizer may added into the photosensitive layer of the radiation-sensitive planographic printing plate of the present invention to impart flexibility to the coated layer. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, and the like.

The photosensitive layer of the radiation-sensitive planographic printing plate of the present invention can be produced by normally dissolving the above-described components in a solvent and coating the solution on a proper support.

Examples of the solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water but are not limited to these.

These solvents may be used singly or as a combination of two or more kinds thereof. The concentration of the total components (total solid components including additives) in the coating liquid is in the range of preferably from 1 to 50% by weight. The desirable coated amount (solids) after coating and drying on the support is generally in the range of from 0.5 to 5.0 g/$m^2$.

The coating liquid can be applied by various methods. Examples of the coating method include bar coating, rotational spin coating, spraying, curtain coating, dipping, air-knife coating, blade coating, and roll coating.

To improve the coating property, into the photosensitive layer of the radiation-sensitive planographic printing plate of the present invention can be added a surface active agent such as, for example, a fluorine-based surface active agent as described in Japanese Patent Laid Open No. 62-170950. The preferred addition amount of the surface active agent is in the range of from 0.01 to 1%, andmore preferably, from 0.05 to 0.5% by weight based on the total solid components of the photosensitive layer of the radiation-sensitive planographic printing plate.

The support (substrate) used for the planographic original plate, on which the image-forming material is coated in the present invention, is a dimensionally stable plate and materials conventionally used as the support for printing plates can be suitably used in this invention. Specific examples of the support include paper, paper laminated with a plastic (e.g., polyethylene, polypropylene, polystyrene, and the like.), a metal plate such as aluminum (including aluminum alloys), zinc, iron, copper, and the like., a plastic film such as diacetyl cellulose, triacetyl cellulose, cellulose propionate, cellulose butyrate, cellulose butyrate acetate, cellulose nitrate, polyethylene terephthalate, polyethylene, polystyrene, polypropylene, polycarbonate, polyvinyl acetal, and the like., and a paper or a plastic film laminated or vapor-deposited with the above-described metal. Among these materials, an aluminum plate is particularly preferred. Examples of the aluminum plate include a pure aluminum plate and an aluminum alloy plate. Examples of the aluminum alloy plate are alloys of aluminum with metal(s) such as silicon, copper, manganese, magnesium, chromium, zinc, lead, bismuth, nickel, and the like. These alloys may contain small amounts of iron and titanium along with other negligible amounts of impurities.

Back Coat

On the back surface of the support, if necessary, a back coat is formed. As such a back coat, a coated layer of an organic high-molecular weight compound described in JP-A No. 5-45885 or a coated layer comprising a metal oxide obtained by hydrolyzing and polycondensing an organic or inorganic metal compound described in JP-A No. 6-35174 is preferably used.

Among these coating layers, a layer of an alkoxy compound of silicon such as $Si(OCH_3)_4$, $Si(OC_2H_5)_4$, $Si(OC_3H_7)_4$, $Si(OC_4H_9)_4$, and the like, is particularly preferred because these compounds are inexpensive and easily available and the coating of the metal oxide obtained therefrom is excellent in hydrophilic property.

The radiation-sensitive planographic printing plate of the present invention can be prepared as described above. To the radiation-sensitive planographic printing plate, a heat-sensitive record is directly and imagewise applied by, for example, a thermal recording head, or the like. Alternatively, the printing plate is imagewise exposed by a solid laser or a semiconductor laser emitting infrared rays having wavelengths from 760 to 1200 nm. In the present invention, after thermal recording or the laser-irradiation, the printing plate is processed with water and, if necessary, coated with gum, and mounted on a printing machine to carry out printing, or alternatively, after thermal recording or the laser-irradiation, the printing plate may be immediately mounted on a printing machine to carry out printing. But in both cases, it is preferred to apply a thermal treatment after thermal recording or the laser-irradiation. As conditions for the thermal treatment, it is preferred to carry out the thermal treatment for from 10 seconds to 5 minutes in a temperature range of from 80° C. to 150° C. Through the thermal treatment, during thermal recording or laser-irradiation, heat necessary for recording or the laser energy can be reduced.

The planographic printing plate obtained by such treatments is mounted on an offset printing machine after being processed with water or as is and is used for printing many prints.

Also, as the result of investigating the properties of the photosensitive layer, the present inventors have found that by forming the photosensitive layer on a support as a hydrophilic layer, a layer that has a high hydrophilic property and is not dissolved off during processing can be obtained. For example, on a support, such a planographic printing plate provides a layer that includes a polymer compound having a sulfonic acid group in a side chain such that portions among the chains are cross-linked. A photosensitive or a heat-sensitive layer may also be provided on this layer. As this polymer compound having a sulfonic acid group in a side chain such that the portions among the chains are cross-linked, a polymer compound which can be obtained by cross-linking, with a cross-linking agent or the like, side chains of polymer compounds which have sulfonic acid group(s) or which have group(s) which can react wuth sulfonic acid precursor groups or to cross-linking agents is favorable. In cases in which a polymer having group(s) which can react with sulfonic acid precursor groups or to cross-linking agents is used, it is necessary to generate sulfonic acid groups with heat dispersion.

That is, it is favorable to form (1) a layer containing the reaction product of a hydrolytic polymerizable compound represented by the above-described formula (1) and a compound having in the same molecule at least one functional group selected from among a sulfonic acid ester group, a disulfone group, a sulfonimide group, and an alkoxyalkyl ester group and at least one functional group selected among —OH, $—NH_2$, —COOH, $—NH—CO—R_3$, and $—Si(OR_4)_3$ [wherein $R_3$ and $R_4$ each represents an alkyl group or an aryl group, and wherein $R_3$ and $R_4$ may be the same or different in cases in which both $R_3$ and $R_4$ are present in the compound] (2) a layer containing a hydrolytic polymerization product of the hydrolytic polymerizable compound shown by the foregoing formula (1) and a compound having at least one functional group (functional group (a-1)) selected from among a sulfonic acid ester group, a disulfone group, a sulfonimide group, and an alkoxyalkyl ester group and, or (3) a layer on a support composed of each of the above-described layers and further containing the water-insoluble particles, subject this layer to thermal treatment and use this layer as the hydrophilic layer with formed sulfonic acids.

Also, the high hydrophilic property caused by the hydrophilic group of the above-described specific compound can be realized, and because the compound is cross-linked using a cross-linking agent such as tetraalkoxysilane, and the like., to harden the film of a high-molecular weight compound, the layer which is not dissolved off at processing and the planographic original plate which is not stained in severe printing conditions can be obtained. Also, by incorporating the water-insoluble particles described above in the layer containing the high-molecular weight compound which has a sulfonic acid group in a side chain such that the portions among the chains are cross-linked, an unevenness is formed on the surface of the hydrophilic layer and water-holding property is improved, whereby the hydrophilic property is increased, which is suitable.

Also, in a conventional planographic original plate which does not form a layer having a hydrophilic property, it is necessary to render the support itself hydrophilic and even in a support that uses aluminum and has a hydrophilic property, a hydrophilic property satisfactory for actual use cannot be obtained without applying a surface treatment. On the other hand, because the planographic original plate having formed the hydrophilic layer has a strong layer having a high hydrophilic property on the support, various kinds of supports can be easily used without need of a pre-treatment such as a surface treatment.

In the radiation-sensitive planographic printing plate having formed such a hydrophilic layer, radiation-sensitive recording layer such as a photosensitive layer or a heat-sensitive layer is formed on the hydrophilic layer. As the radiation-sensitive recording layer, a layer containing a positive type sensitive composition or a negative-working sensitive composition can be properly selected according to the purposes.

DESCRIPTION OF THE PREFERRED EMBODIMENTS

The following Examples are intended to illustrate the present invention more practically but not to limit it in any way.

Examples 1 and 2 Comparative Examples 1 and 2

[Preparation of Support]

After washing an aluminum plate (quality 1050) of 0.30 mm in thickness with trichloroethylene and degreasing the plate, the surface of the aluminum plate was grained using nylon brushes and an aqueous suspension of pumice stone of 400 mesh and washed well with water. The plate was immersed in an aqueous solution of 25% sodium hydroxide at 45° C. for 9 seconds to perform etching and after washing with water, the plate was further immersed in an aqueous solution of 2% $HNO_3$ for 20 seconds followed by washing with water. In this case, the etched amount on the grained surface was about 3 $g/m^2$. Then, the plate was subjected to anodic oxidation using an aqueous solution of 7% $H_2SO_4$ as an electrolyte at a current density of 15 $A/dm^2$ to form a DC anodically oxidized film of 2.4 $g/m^2$ and then washed with water and dried.

[Preparation of Coating Liquid for Image-Forming Material]

After placing 4 g of tetraethoxysilane and 10 g of methyl ethyl ketone in a reaction vessel, 1.4 g of an aqueous solution of 0.05N hydrochloric acid was added thereto followed by vigorously stirring to cause partial hydrolytic polymerization, whereby a uniform solution of an inorganic component was obtained. Then, by dissolving the following components in the solution, coating liquids A-1 and A-2 for Examples 1 and 2 respectively were obtained. In this case, the coating liquid A-1 was prepared using the compound (1-1) described above and the coating liquid A-2 was prepared using the compound (1-2) described above.

| | |
|---|---|
| Compound (1-1) or (1-2) | 3 g |
| Infrared absorbent IR 125 (made by Wako Pure Chemical Industries, Ltd.) | 0.15 g |
| Methyl ethyl ketone | 9 g |
| γ-Butyrolactone | 6 g |

Furthermore, as for the Comparative Examples, by following the same procedure as the preparations of the coating liquid A-1 and A-2 for Examples 1 and 2 except that tetraethoxysilane and hydrochloric acid were not added, coating liquids B-1 and B-2 for Comparative Examples 1 and 2 were obtained.

[Preparation of Planographic Original Plate]

Then, each of the coating liquids A-1, A-2, B-1, and B-2 for image-forming materials thus obtained was coated on the above-described support and dried at 80° C. for 3 minutes to provide planographic original plates [A-1], [A-2], [B-1], and [B-2]. Each coated amount of the coated layer after drying was 1.0 g/$m^2$. In addition, the value of the waterdrop contact angle in air of each planographic original plate before and after light-exposure is shown in Table 1 below. The waterdrop contact angle in air was measured using CONTACT ANGLE METER CA-Z, manufactured by Kyouwa Kaimen Kagaku K.K.

[Printing Test]

Each of the planographic original plates [A-1], [A-2], [B-1], and [B-2] obtained was imagewise exposed by a YAG laser emitting an infrared ray having a wavelength of 1064 nm.

Each of the planographic original plates [A-1], [A-2], [B-1], and [B-2] after exposure was used as it was for printing using Hidel SOR-M. In this case, the generation of stains at the non-image portions of the prints was observed. Also, printing of many prints was carried out and the number of prints which could be printed without generating stains at the non-image portions was confirmed, which was defined to be an press run number. The results obtained are shown in Table 1 below.

To each of the solutions made up of the compositions described above were added 0.3 g of water/85% phosphoric acid (mixed solution of 1/1 by weight) and the reactions were carried out for one hour at room temperature. Then, to the solutions were added the following composition:

| | |
|---|---|
| Infrared absorbent IR 125 (made by Wako Pure Chemical Industries, Ltd.) | 0.15 g |
| Methyl ethyl ketone | 9 g |
| γ-Butyrolactone | 6 g |

Thereafter, the result was mixed with stirring to provide uniform coating liquids A-3 to A-8 for Examples 3 to 8.

In this case, the coating liquid A-3 was prepared using the compound (1-3) described above, and similarly, the coating liquids A-4 to A-8 were prepared using the compound (1-4) to (1-8), respectively.

Furthermore, as the Comparative Examples, by following the same procedures of preparing the coating liquids A-3 to A-4 for Examples 3 and 4 with the exception of not adding tetraethoxysilane, the coating liquids B-3 and B-4 for Comparative Examples 3 and 4 were obtained.

By coating on the same kind of support obtained in Example 1 each of the coating liquids obtained in the same manner as in Example 1, planographic original plates [A-3] to [A-8], [B-3] and [B-4] were obtained. The coated weight of each of the coated layers after drying was 1.4 g/$m^2$. In addition, the waterdrop contact angle in air of each of the planographic original plates before and after exposure is shown in Table 2 below. The measurement apparatus of the waterdrop contact angle in air was the same as that in Example 1.

TABLE 1

| Example or Comparative Example | Kind of planographic original plate | Kind of compound A | Kind of hydrolytic polymerizable compound | Stain at non-image portions in initial printing | Press run | Waterdrop contact angle in air: Non-exposed portion | Waterdrop contact angle in air: Exposed portion |
|---|---|---|---|---|---|---|---|
| Ex. 1 | [A-1] | (1-1) | Tetraethoxysilane | No problem | 35,000 prints | 80° | 5° |
| Ex. 2 | [A-2] | (1-2) | Tetraethoxysilane | No problem | 45,000 prints | 90° | 10° |
| Com. Ex. 1 | [B-1] | (1-1) | — | No problem | 12,000 prints | 85° | 3° |
| Com. Ex. 2 | [B-2] | (1-2) | — | No problem | 8,000 prints | 92° | 10° |

Examples 3 to 8, Comparative Example 3 to 4

| | |
|---|---|
| Each of Compounds (1-3) to (1-8) | 3 g |
| Tetraethoxysilane | 1 g |
| Methyl ethyl ketone | 9 g |

About each of the planographic original plates [A-3] to [A-8], [B-3] and [B-4] obtained, the printed test was performed by the same method as in Example 1. The results obtained are shown in Table 2 below.

TABLE 2

| Example or Comparative Example | Kind of planographic original plate | Kind of compound A | Kind of hydrolytic polymerizable compound | Stain at non-image portions in initial printing | Press run | Waterdrop contact angle in air: Non-exposed portion | Waterdrop contact angle in air: Exposed portion |
|---|---|---|---|---|---|---|---|
| Ex. 3 | [A-3] | (1-3) | Tetraethoxysilane | No problem | 56,000 prints | 110° | 15° |
| Ex. 4 | [A-4] | (1-4) | Tetraethoxysilane | No problem | 67,000 prints | 99° | 10° |
| Ex. 5 | [A-5] | (1-5) | Tetraethoxysilane | No problem | 81,000 prints | 83° | 7° |
| Ex. 6 | [A-6] | (1-6) | Tetraethoxysilane | No problem | 55,000 prints | 85° | 8° |
| Ex. 7 | [A-7] | (1-7) | Tetraethoxysilane | NO problem | 50,000 prints | 90° | 12° |
| Ex. 8 | [A-8] | (1-8) | Tetraethoxysilane | No problem | 81,000 prints | 110° | 10° |
| Com. Ex. 3 | [B-3] | (1-3) | — | No problem | 21,000 prints | 101° | 11° |
| Com. Ex. 4 | [B-24] | (1-4) | — | No problem | 15,000 prints | 95° | 9° |

Examples 9 AND 10

| | |
|---|---|
| Compound (1-9) or (1-10) | 3 g |
| Tetramethoxysilane | 1 g |
| Methyl ethyl ketone | 9 g |

To the solution made up of the above composition was added 0.3 g of water/85% phosphoric acid (mixed solution of 1/1 by weight) and the reaction was carried out for one hour at room temperature. To this solution was added the following composition followed by mixing with stirring to provide coating liquids A-9 and A-10 for Examples 9 and 10, respectively.

| | |
|---|---|
| Acid generating agent: 4-[4-{(N,N-Di(choroethyl)}-2-chloro-phenyl]-2,6-bis-trichloromethyl-S-triazine (PAG2-5) | 0.15 g |
| Methyl ethyl ketone | 9 g |
| γ-Butyrolactone | 6 g |

In this case, the coating liquid A-9 was prepared using the compound (1-9) and the coating liquid A-10 using the compound (1-10). In addition, the acid generating agent PAG2-5 was synthesized by the following method.

[Synthesis of PAG2-5]

55.52 g (0.2 mol) of N,N-bis(2-chloroethyl)-3-chloro-4-cyanoanilline, 173.28g (1.2 mols) of trichloroacetonitrile, 21.63 g (0.2 mol) of anisole, and 100 ml of dibromomethane were placed in a three-necked flask, and 13.34 g (0.05 mol) of aluminum tribromide were added to the mixture with stirring. Then, while maintaining the inside temperature at 43 to 46° C., a hydrochloric acid gas was introduced. After continuing the introduction of the hydrochloric gas for 4 hours while maintaining the same temperature, 173.28 g (1.2 mols) of trichloroacetonitrile and 13.34 g (0.05 mol) of aluminum tribromide were added and the introduction of the hydrochloric acid gas was continued for 8 hours. Thereafter, the introduction of the hydrochloric acid gas was stopped. After stirring the reaction mixture for 9 hours at an inside temperature of 43 to 46° C., the stirring was stopped, and the reaction mixture was allowed to stand for 24 hours. Thereafter, the solvent was distilled off under reduced pressure and the reaction product was extracted using 2 liters of ethyl acetate. After washing the extract 3 times with one liter of water, the product was concentrated under reduced pressure. Then, after adding 1000 ml of ethanol and 500 ml of a saturated aqueous solution of sodium hydrogencarbonate to the concentrated liquid, the mixture was stirred for 4 hours. Crystals formed were collected by filtration and after washing using 250 ml of water and 500 ml of ethanol, the crystals were dried. The amount of the product obtained was 71 g (yield 63%).

By coating each of the coating liquids A-9 and A-10 on the same kind of support obtained in Example 1, using the same method as in Example 1, the planographic original plates [A-9] and [A-10] were obtained. The coated weight of each of the coated layers after drying was 1.0 g/m$^2$. In addition, the waterdrop contact angle in air of each planographic original plates before and after exposure was 1.0 g/m$^2$. The measurement apparatus of the waterdrop contact angle in air was the same as that in Example 1.

Each of the planographic original plates [A-9] and [A-10] was exposed imagewise with ultraviolet rays using an light-exposure apparatus for PS plates having a metal halide lamp as the light source. After exposure, each of the planographic original plates [A-9] and [A-10] was heat-treated for 3 minutes at 100° C., and thereafter, the evaluation of the number of prints was performed by the same method as in Example 1. The results obtained are shown in Table 3 below.

TABLE 3

| Example | Kind of planographic original plate | Kind of compound A | Kind of hydrolytic polymerizable compound | Stain at non-image portions in initial printing | Press run | Waterdrop contact angle in air | |
|---|---|---|---|---|---|---|---|
| | | | | | | Non-exposed portion | Exposed portion |
| Ex. 9 | [A-9] | (1-9) | Tetramethoxysilane | No problem | 57,000 prints | 79° | 17° |
| Ex. 10 | [A-10] | (1-10) | Tetramethoxysilane | No problem | 61,000 prints | 80° | 19° |

Example 11 TO 14

In Examples 11 to 14, the polymer of each illustrated compound was selected as shown below and 40 mg of an aqueous solution of 50% phosphoric acid was added to a solution of 0.4 g of each polymer. 0.4 g of tetraethoxysilane (cross-linking agent), 40 mg of IRG 22 (infrared absorbent, made by Nippon Kayaku Co., Ltd.), and 1.6 g of methyl ethyl ketone and the mixture was stirred for 10 minutes. There after, to the solution were added 4 g of a 10% methyl ethyl ketone dispersion of silica gel particles (Silicia #445, trade name, made by Nippon Silisia Kagaku K.K., particle size measured by a coal counter method: 3.5 μm) dispersed by a paint shaker using glass beads to form a coating liquid and the liquid was coated on a PET substrate, the surface of which was subjected to a corona discharging treatment using a rod bar #20.

After applying an exposure imagewise to each of the heat-sensitive planographic original plates using a Pearl setter (infrared laser having an oscillation wavelength of 908 nm, output 1.2 W, made by Presstek Co.) at a main scanning speed of 2 meters/second, the plates were allowed to stand for 12 hours at room temperature and then were mounted on a printing machine without applying any post treatment and printing was carried out. As the printing machine, Ryoubi 3200 was used, as the fountain solution, a 1/100 diluted liquid of RU-3 was used, and as the ink, an ink F Gloss "sumi" was used. About each of 4 kinds of the compound used, clear prints having no stain were obtained when 1000 sheets were printed.

| [Example] | [Illustrated Compound] | [Stain] |
|---|---|---|
| 11 | 1–4 | None |
| 12 | 1–11 | None |
| 13 | 1–13 | None |
| 14 | 1–9 | None |

Example 15 TO 18

To a solution made up of 0.4 g of the polymer 1-11 as the illustrated compound, 0.4 g of tetraethoxysilane (cross-linking agent) 40 mg of IRG 22 (infrared absorbent, made by Nippon Kayaku Co. Ltd.) and 1.6 g of methyl ethyl ketone was added 40 mg of an aqueous solution of 50% phosphoric acid and the mixture was stirred for 10 minutes. Thereafter, to the dispersion was added 4 g of a 10% methyl ethyl ketone solution of particles (A to D) dispersed using a paint shaker using glass beads to form a coating liquid and the liquid was coated on a PET substrate and subjected to a corona discharging treatment using a rod bar #20.

Each of the heat-sensitive planographic original plates was exposed as in Examples 11 to 14 and printing was performed without being processed (developed). The results of printing 1000 sheets are shown below.

| Example | Particles (mean particle size μ) | Stain (1000th print) |
|---|---|---|
| 15 | A: $TiO_2$ rutile (1.0) | None |
| 16 | B: $Al_2O_3$ (2.3) | None |
| 17 | C: $SiO_2$ (1.8) | None |
| 18 | D: Cross-linked acrylic resin microgel (0.5) | None |

Examples 19 AND 20

[Preparation of Support]

After washing an aluminum plate (quality 1050) of 0.30 nm in thickness with trichloroethylene and degreasing, the surface thereof was grained using nylon brushes and an aqueous suspension of pumice stone of 400 mesh and the plate was washed well with water. The plate was immersed in an aqueous solution of 25% sodium hydroxide of 45° C. for 9 seconds to carry out etched and after washing with water, the plate was immersed in an aqueous solution of 2% $HNO_3$ for 20 seconds and washed with water. In this case, the etched amount of the grained surface was about 3 g/m$^2$. Then, the plate was subjected to anodic oxidation using 7% $H_2SO_4$ as the electrolyte at a current density of 15 A/dm$^2$ to form a DC anodic-oxidized film of 2.4 g/m$^2$ and then washed with water.

[Preparation of Coating Liquid For Image-Forming Material]

After placing 4 g of tetraethoxysilane and 10 g of methyl ethyl ketone in a reaction vessel, 1.4 g of 0.05 N hydrochloric acid was added thereto and the mixture was vigorously stirred to cause partial hydrolytic polymerization, whereby a uniform solution of inorganic components was obtained. In the solution each of the following compositions was dissolved to obtain coating liquids 19 and 20.

| | |
|---|---|
| Compound (1-11) or (1-17) | 3 g |
| Infrared absorbent IR 125 (made by Wako Pure Chemical Industries, Ltd.) | 0.15 g |
| Methyl ethyl ketone | 9 g |
| γ-Butyrolactone | 6 g |

-continued

| | |
|---|---|
| 10% Methyl ethyl ketone dispersion of silica gel particles (Silicia #445) | 4 g |

[Preparation of Planographic original Plate]

Then, each of the coating liquid obtained was coated on the above-described support and dried for 3 minutes at 80° C. to obtain each of the planographic original plates for Examples 19 and 20. The coated weight of the coated layer after drying was 1.0 g/m$^2$. In addition, the waterdrop contact angle in air of each planographic original plate before and after exposure is shown in Table 4 below. The waterdrop contact angle in air was measured using CONTACT ANGLE METER CA-Z, manufactured by Kyowa Kaimen Kagaku K.K.

[Printing Test]

Each of 4 planographic original plates obtained was exposed imagewise with a YAG laser emitting an infrared ray of a wavelength of 1064 nm. The planographic original plate after exposure was set to the printer manufactured by Harris CO., Ltd. without any post treatment, using an ink Gross "sumi" (manufactured by DIC Co., Ltd.) and a wetting water of 10% aqueous isoprpanol. In this case, whether or not stains were generated at the non-image portions of the prints was observed. In each case, in the initial stage, good prints having no stains at the non-image portions were obtained. Also, many prints were printed and the number of prints which could be printed without forming stains at the non-printed portions was confirmed, which was defined as the press run. The results obtained are shown in Table 4 below.

TABLE 4

| Example | Kind of compound A | Solid particles (silica gel) | Stain at non-image portions in initial printing | Press run | Waterdrop contact angle in air: Non-exposed portion | Waterdrop contact angle in air: Exposed portion |
|---|---|---|---|---|---|---|
| Ex. 19 | (1-11) | Used | No problem | 85,000 prints | 85° | 3° |
| Ex. 20 | (1-18) | Used | No problem | 84,000 prints | 95° | 3° |

Examples 21 AND 22

| | |
|---|---|
| Compound (1-9) or (1-10) | 3 g |
| Tetramethoxysilane | 1 g |
| Methyl ethyl ketone | 9 g |

To the solution made up of the above composition were added 0.3 g of water/85% phosphoric acid (mixed liquid of 1/1 by weight) and the reaction was carried out for one hour at room temperature. Then, to the solution was added the following composition followed by mixing with stirring to obtain the uniform coating liquids for Examples 21 and 22.

| | |
|---|---|
| Acid generating agent: 4-[4-{(N,N-Di(chloroethyl)-amino}-2-chloro-phenyl]-2,6-bis-trichloromethyl-S-triazine | 0.15 g |
| Methyl ethyl ketone | 9 g |
| γ-Butyrolactone | 6 g |
| 10% Methyl ethyl ketone dispersion of silica gel particles (Silicia #445) | 4 g |

By coating each coating liquid obtained on the same kind of support obtained in Example 9 using the same method as in Example 9, each planographic original plate was obtained. The coated weight of the coated layer after drying was 1.0 $g/m^2$. In addition, the waterdrop contact angle in air of each planographic original plate is shown in Table 5 below. The measurement apparatus of the waterdrop contact angle in air was the same as that used in Example 9.

Each of the two kinds of the planographic original plates obtained was imagewise exposed with ultraviolet rays using an exposure apparatus for PS plates using metal halide lamp as the light source. After heat-treating the exposed planographic original plate at 100° C. for 3 minutes, printing of many prints and the evaluation were performed in the same manner as in Example 1. The results obtained are shown in Table 5 below. The same effects as in Examples 11 to 20 were obtained.

[Preparation of Photosensitive Planographic original Plate]

Then, each of the coating liquids A-1, A-2 and B-1 was coated on the above-described support and dried for one minute at 80° C. to obtain photosensitive planographic original plate [A-1], photosensitive planographic original plate [A-2] and photosensitive planographic original plate [B-1].

[Stability Test]

To determine the stability of the photosensitive planographic original plates, the ink receptivity at printing of the sample directly after preparing each photosensitive planographic original plate and the sample after storing for 3 days at a humidity of 75% and at 45° C was determined.

For the measurement of the ink receptivity at printing, the sample was imagewise exposed by a YAG laser emitting an infrared ray having a wavelength of 1064 nm, and after allowing to stand for one day, the sample was used for printing by a printing machine (Hidel SOR-M, manufactured by Heidelberg Co.), at starting the printing, the number of prints until ink was attached was confirmed. The results are shown in Table 6 and Table 7 below.

TABLE 5

| Example | Kind of compound A | Kind of hydrolytic polymerizable compound | Stain at non-image portions in initial printing | Press run | Waterdrop contact angle in air: Non-exposed portion | Waterdrop contact angle in air: Exposed portion |
|---|---|---|---|---|---|---|
| Ex. 21 | (1-9) | Tetramethoxysilane | No problem | 89,000 prints | 85° | 3° |
| Ex. 22 | (1-10) | Tetramethoxysilane | No probiem | 88,000 prints | 95° | 3° |

Examples 21 and 24 Comparative Example 5

[Preparation of Support]

After washing an aluminum plate (quality 1050) of 0.30 mm in thickness with trichloroethylene and degreasing, the surface thereof was grained using nylon brushes and an aqueous suspension of pumice stone of 400 mesh and the plate was washed well with water. The plate was immersed in an aqueous solution of 25% sodium hydroxide of 45° C. for 9 seconds to carry out etching and after washing with water, the plate was immersed in an aqueous solution of 2% $HNO_3$ for 20 seconds and washed with water. In this case, the etched amount of the grained surface was about 3 $g/m^2$.

Then, the plate was subjected to anodic oxidation using 7% $H_2SO_4$ as the electrolyte at a current density of 15 $A/dm^2$ to form a DC anodic-oxidized film of 2.4 $g/m^2$ and then washed with water.

[Preparation of Coating Liquid for Image-Forming Material]

| | |
|---|---|
| Compound (1-1) or (1-2) | 4 g |
| Tetramethoxysilane | 4 g |
| Methanol | 18 g |

To the solution made up of the above composition were added 0.2 g of 1 N hydrochloric acid and the mixture was stirred for 3 hours at 60° C. to cause hydrolytic polymerization, whereby a uniform solution of inorganic components was obtained. Then, in the solution were dissolved 0.15 g of an infrared absorbent (IR 125, made by Wako Pure Chemical Industries, Ltd.) to obtain a coating liquid A-1 for a photosensitive recording layer for Example 23 and a coating liquid A-2 for a photosensitive recording layer for Example 24. In addition, in the above-described coating liquid A-1 for the photosensitive recording layer, the compound (1-1) was used, and in the above-described coating liquid A-2, the compound (1-2) was used.

Also, as Comparative Example 5, by following the same procedure as in Examples 23 and 24 except that the copolymer of tetrahydropyran-2-yl methacrylate and methacryloxy-propyltrimethoxysilane was used in place of the compounds (1-1) and (1-2), a coating liquid B-1 for a photosensitive recording layer for Comparative Example 5 was prepared.

TABLE 6

[Directly after preparation of image-forming material]

| Example or Comparative Example | Kind of planographic original plate | Number of prints until attachment of ink |
|---|---|---|
| Ex. 23 | [A-1] | 10 |
| Ex. 24 | [A-2] | 10 |
| Com. Ex. 5 | [B-1] | 10 |

TABLE 7

[After preservation for 3 days at a humidity of 75% and at a temperature 45° C.]

| Example or Comparative Example | Kind of planographic original plate | Number of prints until attachment of ink |
|---|---|---|
| Ex. 23 | [A-1] | 10 |
| Ex. 24 | [A-2] | 10 |
| Com. Ex. 5 | [B-1] | Not attached |

Example 25 and Comparative Example 6

| | |
|---|---|
| Compound (1-3) | 4 g |
| Tetraethoxysilane | 4 g |
| Methanol | 18 g |

To the solution of the above composition were added 0.2 g of 1 N hydrochloric acid and the mixture was stirred for 3 hours at 60° C. to cause hydrolytic polymerization and obtain an uniform solution of inorganic components. Then, to the solution were added 0.15 g of 4-[4-{(N,N-di(ethoxycarbonylmethyl)amino)phenyl}-2,9-bis-trichloromethyl-S-triazine] as a photo acid generating agent followed by mixing with stirring to prepare a uniform coating liquid A-3 for the photosensitive recording layer for Example 25. Furthermore, as Comparative Example 6, by following the same procedure as in Example 25 except that a copolymer of tetrahydropyran-2-yl methacrylate and methacryloxypropyltrimethoxysilane was used, a coating liquid B-2 for the photosensitive recording layer for Comparison Example 6 was prepared.

[Press Run and Staining Property Test]

By coating the coating liquid for each photosensitive recording layer obtained on the same kind of support as in Example 1 using the same method as in Example 1 to obtain a photosensitive planographic original plates [A-3] and [B-2]. The coated amount of each coated layer after drying was 1.0 $g/m^2$.

Each of the photosensitive planographic original plates [A-3] and [B-2] was exposed imagewise by ultraviolet rays using the exposure apparatus for PS plates having a metal halide lamp as the light source.

After exposure, each sample was heat-treated for 3 minutes at 100° C. to prepare each photosensitive planographic printing plate. Each sample plate was used for printing as it was by a printing machine (Hidel SOR-M, manufactured by Hidelberg co.). In this case, many prints were printed and after printing 10,000 prints, the blur of the image portions of the prints and the stains as the non-image portions were determined. The results obtained are shown in Table 8 below.

TABLE 8

| Example or Comparative Example | Kind of planographic original plate | Blur of image portion | Stain at non-image portion |
|---|---|---|---|
| Ex. 25 | [A-3] | None | None |
| Com. Ex. 6 | [B-1] | None | Yes |

As described above, according to the present invention, radiation-sensitive planographic printing plate which can be processed with water or does not require specific treatments such as a development treatment, rubbing, and the like, after image writing can be provided. In particular, according to the present invention, radiation-sensitive planographic printing plate, which can be directly produced from digital data by recording using a solid laser or a semiconductor laser which emit infrared rays, can be provided.

Also, according to the present invention, a positive type radiation-sensitive planographic printing plate excellent in the printing durability can be provided.

What is claimed is:

1. A photosensitive and heat-sensitive planographic printing plate having on a support a photosensitive layer containing:

a plurality of surface-modified water-insoluble particles; and a reaction product of:

a compound having in a molecule thereof at least one functional group selected from among a sulfonic acid ester group, a disulfone group, a sulfonimide group, and an alkoxyalkyl ester group and at least one functional group selected from among —OH, —$NH_2$, —COOH, —NH—CO—$R_3$, and —$Si(OR_4)_3$, wherein $R_3$ and $R_4$ each represents an alkyl group or an aryl group and wherein $R_3$ and $R_4$ may be the same or different in cases in which both $R_3$ and $R_4$ are present in the compound; and a hydrolytic polymerizable compound represented by the following formula (1):

$$(R_1)_n—X—(OR_2)_{4-n} \quad (1)$$

wherein $R_1$ and $R_2$, which may be the same or different, each represents an alkyl group or an aryl group; X represents Si, Al, Ti, or Zr;

and n represents an integer from 0 to 2, wherein, a group(s) that changes from a hydrophobic property to a hydrophilic property due to radiation or heat, bonds to a solid surface of said surface-modified water-insoluble particles.

2. The planographic printing plate of claim 1, wherein the group that changes from a hydrophobic property to a hydrophilic property due to radiation or heat is a group represented by the following formula (2):

$$L—SO_3R^1 \quad (2)$$

wherein, $R^1$ represents a substituted or unsubstituted alkyl group, a substituted or unsubstituted aryl group, or a cyclic imide group and L represents a divalent or trivalent organic linkage group which bonds to the solid particle surface.

3. The planographic printing plate according to claim 1, wherein said surface-modified particles are cross-linked with a cross-linking agent.

* * * * *